(12) United States Patent
Wojciechowski et al.

(10) Patent No.: US 8,497,747 B1
(45) Date of Patent: Jul. 30, 2013

(54) MICROELECTROMECHANICAL FILTER FORMED FROM PARALLEL-CONNECTED LATTICE NETWORKS OF CONTOUR-MODE RESONATORS

(75) Inventors: Kenneth E. Wojciechowski, Albuquerque, NM (US); Roy H. Olsson, III, Albuquerque, NM (US); Maryam Ziaei-Moayyed, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 313 days.

(21) Appl. No.: 13/039,029

(22) Filed: Mar. 2, 2011

(51) Int. Cl.
*H03H 9/54* (2006.01)

(52) U.S. Cl.
USPC ........... 333/186; 333/190; 333/197; 333/199; 310/366; 310/368; 310/369

(58) Field of Classification Search
USPC ................. 333/186, 190, 197–200; 310/309, 310/311, 321, 323, 366, 368, 369
See application file for complete search history.

(56) References Cited

U.S. PATENT DOCUMENTS

| | | | |
|---|---|---|---|
| 6,680,660 B2 | 1/2004 | Nguyen | |
| 7,194,247 B2 | 3/2007 | Tikka et al. | |
| 7,295,088 B2 | 11/2007 | Nguyen et al. | |
| 7,319,371 B2 | 1/2008 | Ten Dolle et al. | |
| 7,319,372 B2 | 1/2008 | Pan et al. | |
| 7,342,351 B2 | 3/2008 | Kubo et al. | |
| 7,492,241 B2 | 2/2009 | Piazza et al. | |
| 7,498,901 B2 * | 3/2009 | Naniwada et al. | 333/133 |
| 7,550,904 B2 | 6/2009 | Kawakubo et al. | |
| 7,755,454 B2 * | 7/2010 | Tanaka et al. | 333/186 |
| 2006/0290449 A1 | 12/2006 | Piazza et al. | |
| 2009/0237180 A1 | 9/2009 | Yoshida | |

OTHER PUBLICATIONS

H. Chandrahalim et al.; "Fully-Differential Mechanically-Coupled PZT-on-Silicon Filters"; 2008 IEEE International Ultrasonics Symposium Proceedings, Nov. 2-5, 2008, pp. 713-716.*
K.E. Wojciechowski et al.; "Super High Frequency Width Extensional Aluminum Nitride (AlN) MEMS Resonators"; 2009 IEEE International Ultrasonics Symposium Proceedings, Sep. 20-23, 2009, pp. 1179-1182.*
R.H. Olsson III et al.; "VHF and UHF Mechanically Coupled Aluminum Nitride MEMS Filters"; 2008 IEEE International Frequency Control Symposium, May 19-21, 2008, pp. 634-639.*
S.S. Li et al.; "An MSI Micromechanical Differential Disk-Array Filter"; Transducers & Eurosensors '07, The 14th International Conference on Solid-State Sensors, Actuators and Microsystems, Lyon, France, Jun. 10-14, 2007, pp. 307-311.*

(Continued)

*Primary Examiner* — Barbara Summons
(74) *Attorney, Agent, or Firm* — Martin I. Finston

(57) ABSTRACT

A microelectromechanical (MEM) filter is disclosed which has a plurality of lattice networks formed on a substrate and electrically connected together in parallel. Each lattice network has a series resonant frequency and a shunt resonant frequency provided by one or more contour-mode resonators in the lattice network. Different types of contour-mode resonators including single input, single output resonators, differential resonators, balun resonators, and ring resonators can be used in MEM filter. The MEM filter can have a center frequency in the range of 10 MHz-10 GHz, with a filter bandwidth of up to about 1% when all of the lattice networks have the same series resonant frequency and the same shunt resonant frequency. The filter bandwidth can be increased up to about 5% by using unique series and shunt resonant frequencies for the lattice networks.

20 Claims, 14 Drawing Sheets

OTHER PUBLICATIONS

John R. Clark, et al, Parallel-Resonator HF Micromechanical Bandpass Filters, Digest of Technical Papers, 1997, International Conference, Chicago, Illinois, Jun. 16-19, 1997, pp. 1161-1154.

Gianluca Piazza, et al, Single-Chip Multiple-Frequency ALN MEMS Filters Based on Contour-Mode Piezoelectric Resonators, Journal of Microelectromechanical Systems, vol. 16, No. 2, Apr. 2007. pp, 319-328.

Roy H. Olsson III, et al, Post-CMOS Compatible Aluminum Nitride MEMS Filters and Resonant Sensors, Proceedings of the 2007 IEEE International Frequency Control Symposium, pp. 412-419, 2007.

Gianluca Piazza, et al, One and two Port Piezoelectric Higher Order Countour-Mode MEMS Resonators for Mechanical Signal Processing, Solid-State Electronics 51 (2007) 1596-1608.

Mustafa U. DeMirci, et al, Signal-Resonator Fourth-Order Micromechanical Disk Filters, 18$^{th}$ Int. IEEE Micro Electro Mechanical Systems Conf, Miami, Florida, Jan. 30-Feb. 3, 2005. pp. 207-210.

\* cited by examiner

Section 1 - 1

US 8,497,747 B1

MICROELECTROMECHANICAL FILTER FORMED FROM PARALLEL-CONNECTED LATTICE NETWORKS OF CONTOUR-MODE RESONATORS

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to microelectromechanical (MEM) filters and, in particular, to MEM filters based on contour-mode resonators.

BACKGROUND OF THE INVENTION

Wide bandwidth filters are needed to achieve high data rates in many different types of communication systems using communication protocols such as code division multiple access (CDMA), global system for mobile communications (GSM), and worldwide interoperability for microwave access (WiMAX). Such communication systems require the use of a large percent (>1%) bandwidth at intermediate frequencies (IF) which are, for example, in the range of about 70-900 MegaHertz (MHz). Typically such large percent bandwidths are achieved at low IF frequencies using surface acoustic wave (SAW) devices which are hybrid devices and not easily integrated directly into complementary metal-oxide semiconductor (CMOS) chips. Alternately, bulk acoustic wave (BAW) and film bulk acoustic resonator (FBAR) technologies have been used to form filters for communications systems. Each of the SAW, BAW and FBAR technologies have limitations for forming large percent (>1%) bandwidth filters which can be directly integrated into CMOS chips.

SUMMARY OF THE INVENTION

The present invention overcomes these limitations of the prior art by providing microelectromechanical (MEM) filters comprising a plurality of lattice networks which are electrically connected in parallel and which are formed using contour-mode resonators.

With each lattice network being formed from one or more contour-mode resonators, a series resonant frequency, a shunt resonant frequency and a center frequency for each lattice network can be set independently from all of the other lattice networks in the MEM filter of the present invention, and this can be used to provide an arbitrary percent bandwidth for the MEM filter which can be up to about 5% or more.

The MEM filters of the present invention are compatible with CMOS technology to allow one or more MEM filters to be directly incorporated into a CMOS integrated circuit (IC) with the MEM filters being located above the CMOS circuitry.

The present invention relates to a microelectromechanical (MEM) filter, comprising a substrate, and a plurality of lattice networks formed on the substrate and electrically connected in parallel to filter an electrical signal received into at least one input of the plurality of lattice networks and to provide the filtered electrical signal to at least one output of the plurality of lattice networks. Each lattice network has a series resonant frequency and a shunt resonant frequency and comprises at least one contour-mode resonator to provide the series resonant frequency and the shunt resonant frequency.

In certain embodiments of the present invention, the series resonant frequency is substantially the same for each lattice network, and the shunt resonant frequency is also substantially the same for each lattice network. In these embodiments of the present invention, the MEM filter can have a filter bandwidth (also referred to herein as a 3 dB bandwidth or a percent bandwidth) which can range, for example, from 0.25% to about 1%.

In other embodiments of the present invention, the series resonant frequency is different for each lattice network, and the shunt resonant frequency is also different for each lattice network. In these embodiments of the present invention, the series resonant frequencies and the shunt resonant frequencies of the plurality of lattice networks can be spaced apart in frequency about a center frequency of the MEM filter to provide a filter bandwidth which can be greater than or equal to 1% of the center frequency and generally up to about 5%. This can be done, for example, by alternating the series resonant frequencies and the shunt resonant frequencies and spacing the resonant frequencies apart in frequency about a center frequency of the MEM filter. This can be done, for example, by providing a substantially equal frequency interval between each series resonant frequency and an adjacent shunt resonant frequency. The center frequency can be, for example, in a range of 10 MegaHertz (MHz) to 10 GigaHertz (GHz) with the exact center frequency being selected according to a particular application of the MEM filter.

According to the present invention, there are many different ways of forming the lattice networks which are electrically connected in parallel to form the MEM filter. As an example, each lattice network can be a single-ended lattice network having a single input and a single output. As another example, each lattice network can be a differential lattice network formed from a pair of differential contour-mode resonators, with each differential contour-mode resonator having a positive input, a negative input, a positive output and a negative output. The positive input of a first differential contour-mode resonator of the pair of differential contour-mode resonators can be electrically connected to the positive input of a second differential contour-mode resonator of the pair of differential contour-mode resonators to form a positive input terminal for each lattice network; and the negative inputs of the first and second differential contour-mode resonators can also be electrically connected together in parallel to form a negative input terminal for that lattice network. The positive output of the first differential contour-mode resonator can be electrically connected to the negative output of the second differential contour-mode resonator to form a positive output terminal for that lattice network; and the negative output of the first differential contour-mode resonator can be electrically connected to the positive output of the second differential contour-mode resonator to form a negative output terminal for that lattice network.

As yet another example, each lattice network can be a balanced-unbalanced (balun) lattice network. Such a balun lattice network can be formed, for example, from a first balun contour-mode resonator and a second balun contour-mode resonator, with each balun contour-mode resonator having a single input, a positive output, and a negative output. The single inputs of the two balun contour-mode resonators can be electrically connected in parallel to form an input terminal for that lattice network; and with the positive output of the first balun contour-mode resonator can be electrically connected to the negative output of the second balun contour-mode resonator to form a positive output terminal of that lattice network. The negative output of the first balun contour-mode resonator can be electrically connected to the positive output of the second balun contour-mode resonator to form a negative output terminal of that lattice network. In other embodiments of the present invention, the inputs and outputs of the balun contour-mode resonators can be reversed to provide a MEM filter having a pair of differential inputs and a single output.

In still another example, each lattice network can be formed from one or more ring contour-mode resonators. Each ring contour-mode resonator can have two modes of oscillation, with one mode of oscillation being at the series resonant frequency, and with the other mode of oscillation being at the shunt resonant frequency. A frequency separation between the series resonant frequency and the shunt resonant frequency of each ring contour-mode resonator can, in some cases, be defined by one or more internal notches which extend into the ring contour-mode resonator. In the plurality of lattice networks formed from the ring contour-mode resonators, the series resonant frequency can be different for each lattice network, and the shunt resonant frequency can also be different for each lattice network.

According to the present invention, each contour-mode resonator can, in some cases, be an overtone contour-mode resonator. Such an overtone contour-mode resonator can have different numbers L and M of input electrodes and output electrodes, respectively. This can be useful, for example, to form balun contour-mode resonators which can be used to form MEM filters based on a plurality of parallel-connected balun lattice networks.

When differential contour-mode resonators are used to form a plurality of differential lattice networks and the number of input and output electrodes are different in the differential contour-mode resonators, each differential lattice network can be formed by electrically connecting together in parallel a pair of oppositely-oriented differential contour-mode resonators (e.g. a first differential contour-mode resonator with L input electrodes and M output electrodes, and a second differential contour-mode resonator with M input electrodes and L output electrodes). This can be advantageous to provide substantially the same input and output impedances for each differential lattice network, and also to provide substantially the same input and output impedances for the MEM filter.

The substrate used for the MEM filter of the present invention can comprise a substrate material selected from the group consisting of a semiconductor (e.g. silicon), glass, alumina, and sapphire. Each contour-mode resonator can be formed directly on the substrate using a layer of a piezoelectric material selected from the group consisting of aluminum nitride (AlN), lithium niobate (LiNbO$_3$), zinc oxide (ZnO), and lead-zirconate-titanate (PZT).

The present invention also relates to a MEM filter which comprises a substrate, and a plurality of lattice networks formed on the substrate and electrically connected in parallel, with each lattice network further comprising: a plurality of input and output terminals including a positive input terminal, a negative input terminal, a positive output terminal and a negative input terminal; a first contour-mode resonator having a series resonant frequency $f_s$, with the first contour-mode resonator being electrically connected between the positive input terminal and the positive output terminal; a second contour-mode resonator having the series resonant frequency $f_s$, with the second contour-mode resonator being electrically connected between the negative input terminal and the negative output terminal; a third contour-mode resonator having a shunt resonant frequency $f_{sh}$, which is different from the series resonant frequency $f_s$, with the third contour-mode resonator being electrically connected between the positive input terminal and the negative output terminal; and a fourth contour-mode resonator having the shunt resonant frequency $f_{sh}$, with the fourth contour-mode resonator being electrically connected between the negative input terminal and the positive output terminal. The input and output terminals of each lattice network can be electrically connected through an inductor to a ground electrical connection (also referred to herein as ground or as a ground terminal).

In certain embodiments of the present invention, the series resonant frequency $f_s$ and the shunt resonant frequency $f_{sh}$ of each lattice network in the MEM filter can be unique (i.e. different from the series resonant frequency $f_s$ and the shunt resonant frequency $f_{sh}$ of all of the other lattice networks in the MEM filter).

Each contour-mode resonator can comprise an overtone contour-mode resonator and can be formed from a piezoelectric material which is selected from the group consisting of aluminum nitride (AlN), lithium niobate (LiNbO$_3$), zinc oxide (ZnO), and lead-zirconate-titanate (PZT). The substrate can comprise a substrate material selected from the group consisting of a semiconductor (e.g. silicon), glass, alumina, and sapphire.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
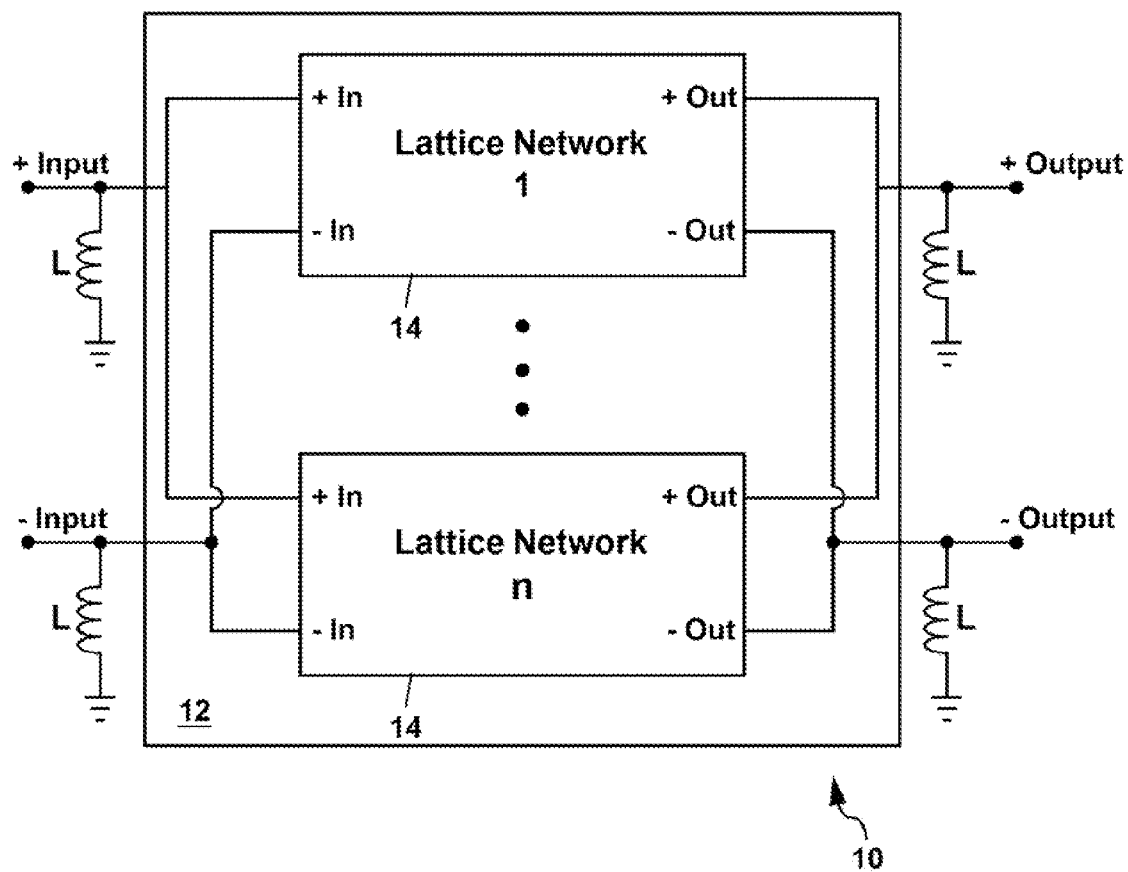
FIG. 1 shows a block diagram of a first example of a MEM filter according to the present invention, with the MEM filter comprising an arbitrary number n of differential lattice networks which are electrically connected in parallel.

Referring to FIG. 1 there is shown a block diagram of a first example of a microelectromechanical (MEM) filter 10 of the present invention. In FIG. 1, the MEM filter 10 comprises substrate 12 on which a plurality n of lattice networks 14 are formed and electrically connected together in parallel. Although only two lattice networks 14 are shown in FIG. 1, those skilled in the art will understand that an arbitrary number n of lattice networks 14 can be provided on the substrate 12 and electrically connected in parallel to form the MEM filter 10. Each lattice network 14 in the example of FIG. 1 can comprise one or more contour-mode resonators 16 as will be described in detail hereinafter to provide two different resonant frequencies (hereinafter referred to as a series resonant frequency $f_s$ and a shunt resonant frequency $f_{sh}$) for that lattice network 14.

The phrase "electrically connected in parallel" is defined herein to mean that all of the inputs of a given type (e.g. +In or −In) for all of the lattice networks 14 in the MEM filter 10 are electrically connected together, and all of the outputs of a given type (e.g. +Out or −Out) for all of the lattice networks 14 in the MEM filter 10 are electrically connected together. Thus, for example, in the MEM filter 10 of the present invention formed from a plurality of differential lattice networks 14 as shown in FIG. 1, the positive inputs (+In) of all of the lattice networks 14 are electrically connected together, and the negative inputs (−In) of all of the lattice networks 14 are electrically connected together, and all of the positive outputs (+Out) of all of the lattice networks 14 are electrically connected together, and all of the negative outputs (−Out) of all of the lattice networks 14 are electrically connected together.

Figure 2A:
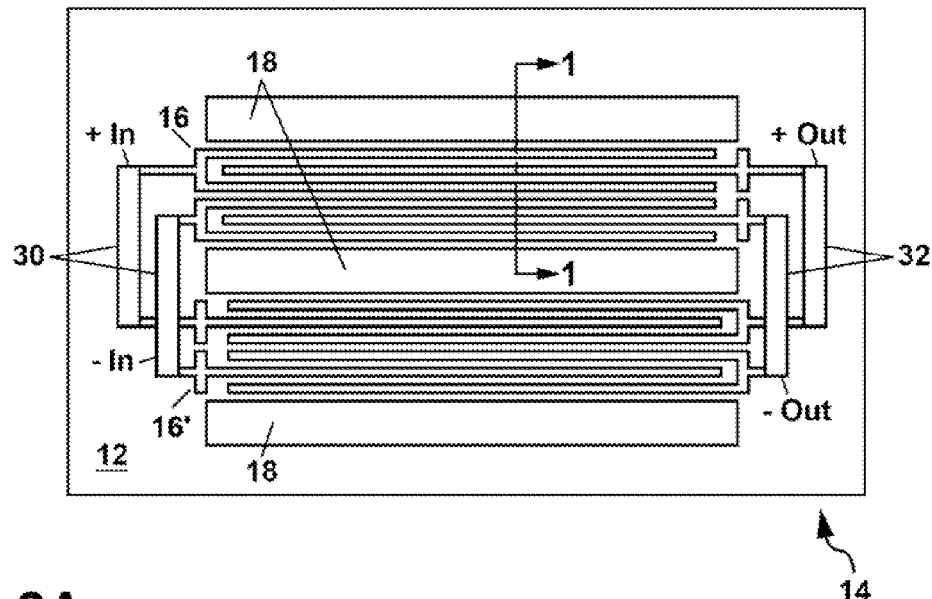
FIG. 2A shows a schematic plan view of one of the differential lattice networks in FIG. 1. Each differential lattice network can be formed from a series contour-mode resonator and a shunt contour-mode resonator, with each resonator having interdigitated electrodes and operating in a overtone acoustic mode.

In the example of FIG. 1, each lattice network 14 is a differential lattice network 14 which can be formed from a series contour-mode resonator 16 and a shunt contour-mode resonator 16' as shown in the schematic plan view of FIG. 2A. In other embodiments of the present invention, each lattice network 14 in FIG. 1 can be formed from a ring contour-mode resonator which operates simultaneously in two different acoustic modes to provide the series resonant frequency $f_s$ and the shunt resonant frequency $f_{sh}$. Ring contour-mode resonators will be described in detail hereinafter (see e.g. FIGS. 10 and 11).

In FIG. 2A, each contour-mode resonator 16 and 16' can be formed on a common substrate 12, and can be electrically and mechanically isolated from the substrate 12. The mechanical isolation can be performed by etching a trench 18 which extends at least partway around and underneath each resonator 16 and 16' so that each resonator 16 and 16' is suspended above the substrate 12. This can be further understood with reference to FIG. 2B which is a schematic cross-section view along the section line 1-1 in FIG. 2A. With each resonator 16 and 16' isolated from the substrate 12, each resonator 16 and 16' can be electrically transduced to oscillate independently in a width extensional mode at a frequency which is determined by the characteristics of that resonator 16 or 16'. For the contour-mode resonators 16 and 16' in FIG. 2A, a piezoelectric material, which is used to form the resonators 16 and 16', is electrically transduced via a $d_{31}$ piezoelectric coefficient.

This generates an acoustic wave in the piezoelectric material which is directed orthogonal to an electric field used to induce the acoustic wave.

The contour-mode resonators 16 and 16' in FIG. 2A can be formed on many different types of substrates 12 including semiconductor substrates (e.g. comprising silicon, germanium, gallium arsenide, indium phosphide, etc.) or insulating substrates (e.g. comprising glass, alumina, sapphire, etc.). The term "silicon" as used herein includes monocrystalline silicon substrates and silicon-on-insulator substrates. The term "glass" as used herein is defined to encompass any type of glass known to the art including silicon dioxide, fused silica and crystalline quartz. When the contour-mode resonators 16 and 16' of FIG. 2A and the other types of contour-mode resonators described hereinafter are formed on a semiconductor substrate 12, the substrate 12 can, in some cases, include electronic circuitry (e.g. CMOS circuitry) formed on the substrate 12 with the contour-mode resonators being formed above or along side of the electronic circuitry (e.g. above a passivation layer which covers CMOS circuitry).

The process for forming the contour-mode resonators 16 and 16' in FIG. 2A will be described hereinafter using a silicon substrate 12. Those skilled in the art will understand that the various process steps used to form the resonators 16 and 16' can be readily adapted for use with other types of substrates 12, or to form the resonators 16 and 16' above a passivation layer on a substrate 12 containing electronic circuitry. Those skilled in the art will also understand that the various process steps described hereinafter can also be used to form other types of contour-mode resonators, including ring contour-mode resonators.

Figure 2B:
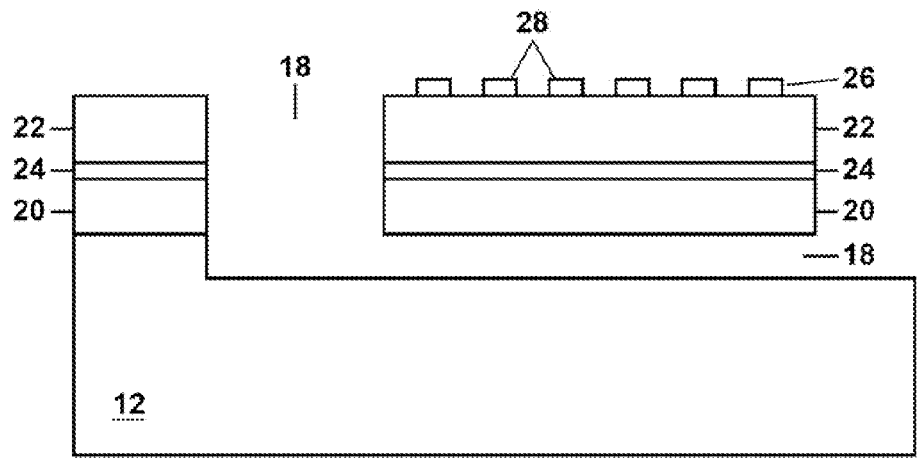
FIG. 2B shows a schematic cross-section view of the differential lattice network in FIG. 2A along the section line 1-1 in FIG. 2A.

In FIG. 2B, a layer 20 of silicon dioxide can be deposited or formed over the substrate 12 when the substrate 12 comprises silicon. This silicon dioxide layer 20, which can be up to about one micron (μm) or more thick, can be used as an etch stop layer for etching down and under the contour-mode resonators 16 and 16', and can also serve as a temperature compensation layer to stabilize the resonant frequencies of the resonators 16 and 16' against changes in temperature during operation of the MEM filter 10. When the silicon dioxide layer 20 is to be used for temperature compensation, the exact thickness of the silicon dioxide layer 20 will be determined by the thickness and composition of an overlying piezoelectric layer 22. As an example, when the piezoelectric layer 22 comprises 0.75 μm of aluminum nitride (AlN), the silicon dioxide layer 20 can have a thickness in the range of 0.90-1.15 μm. The positive thermal coefficient of expansion of the silicon dioxide layer 20 can compensate for the negative thermal coefficient of expansion of the AlN piezoelectric material. In this way, the thermal coefficient of expansion of the AlN piezoelectric material can be effectively reduced from about 33 parts-per-million (ppm) per degree Celsius (° C.) to about 2 ppm/° C. or less for the composite AlN/SiO$_2$ layers.

The silicon dioxide layer 20 can be formed, for example, by a conventional wet oxidation process whereby the silicon substrate material is oxidized to form SiO$_2$ at an elevated temperature (e.g. 1050° C.). Alternately, the silicon dioxide layer 20 can be deposited by a chemical vapor deposition (CVD) process (e.g. low-pressure CVD or plasma-enhanced CVD). In some embodiments of the present invention, the silicon dioxide layer 20 can be omitted altogether (e.g. temperature compensation is not required, or when a glass substrate 12 is used and each lattice network 14 is formed of materials which are chemically resistant to an etchant which is used to etch the trench 18). In yet other embodiments of the present invention, a silicon nitride layer can be substituted for the silicon dioxide layer 20 for use as an etch stop layer, or can be used in combination with the silicon dioxide layer 20. The silicon nitride layer can be up to a few hundred nanometers (nm) thick, and can be deposited by a CVD process.

When the MEM filter 10 is to be formed on a silicon substrate 12 containing CMOS circuitry, a layer of polycrystalline silicon (also termed polysilicon) can be deposited over a passivation layer covering the CMOS circuitry prior to depositing the silicon dioxide layer 20. In this case, the polysilicon and silicon dioxide layers can be deposited by plasma-enhanced CVD (PECVD) at a temperature which is preferably less than about 400° C. to prevent damaging the CMOS circuitry.

In FIGS. 2A and 2B, a lower metallization 24 can be deposited over the silicon dioxide layer 20 and patterned by reactive ion etching to form a ground plane for the contour-mode resonators 16 and 16' being formed, and also to form wiring connected to the ground plane. When the MEM filter 10 including the contour-mode resonators 16 and 16' are formed over CMOS circuitry, the wiring connected to the ground plane can comprise one or more vias (not shown) which can be formed by etching openings down to contact the CMOS circuitry and then filling the openings with an electrically-conductive material such as tungsten. These vias can be formed prior to depositing the lower metallization 24. The lower metallization 24 can comprise aluminum (e.g. an aluminum alloy containing 1% copper), or alternately can be formed of layers of titanium (Ti) about 50 nm thick, titanium nitride (TiN) about 20 nm thick and aluminum (Al) about 50 nm thick. The lower metallization 24 can be deposited, for example, by sputtering.

The piezoelectric layer 22 can be blanket deposited over the substrate 12 and patterned lower metallization 24 by sputtering at a temperature of about 350° C., with the thickness of the piezoelectric layer 22 being, for example, 0.75-1 μm. The piezoelectric material forming the layer 22 can comprise aluminum nitride (AlN), zinc oxide (ZnO), lithium niobate (LiNbO$_3$) or lead-zirconate-titanate (PZT). The piezoelectric material can be highly c-axis oriented to provide a strong piezoelectric coupling. Those skilled in the art will understand that other types of piezoelectric materials known to the art can be used to form the contour-mode resonators in the MEM filter 10 of the present invention.

After deposition, the piezoelectric material 22 can be patterned using a photolithographically-defined etch mask (not shown) and a reactive ion etching step. This etching step can etch down to expose the silicon substrate (or a polysilicon layer) beneath the piezoelectric material 22.

An upper metallization 26 can then be deposited over the piezoelectric layer 22 and patterned by reactive ion etching or liftoff to form a plurality of electrodes 28 to provide signal inputs and signal outputs for each contour-mode resonator 16. This upper metallization 26 can also be patterned to form wiring (e.g. input terminals 30 and output terminals 32 for the lattice network 14 in FIG. 2A) and bond pads to provide electrical connections to the MEM filter 10. The piezoelectric layer 22 can be left in place between the wiring formed from the metallizations 24 and 26 to serve as an electrical insulator. Alternately, the piezoelectric layer 22 can be removed outside the contour-mode resonators 16 and 16', and a layer of an electrically-insulating material (e.g. silicon dioxide or silicon nitride) can deposited over the lower metallization 24 prior to depositing the upper metallization 26, with the electrically-insulating material isolating the upper metallization 26 from the lower metallization 24.

After forming the electrodes 28, an etching step can be used to remove the substrate material underneath the resonators 16 and 16'. For a silicon substrate 12, this etching step can be performed using a selective etchant which can comprise, for example, gaseous silicon hexafluoride ($SF_6$) or xenon difluoride ($XeF_2$). These etchants are preferred for silicon since they are dry-etchants which isotropically etch away the silicon while preventing the possibility for stiction of the suspended contour-mode resonators 16 and 16' to the underlying substrate 12.

Each contour-mode resonator 16 and 16' can be an overtone contour-mode resonator which operates in an overtone mode (i.e. a higher-order mode). In the example of FIGS. 2A and 2B, six electrodes are formed over top of the piezoelectric material 22 to form sixth-order width extensional contour-mode resonators 16 and 16'. As shown in FIG. 2A, these six electrodes 28 are electrically connected to provide a positive input (+In), a negative input (−In), a positive output (+Out), and a negative output (+Out) for each contour-mode resonator 16 and 16'. Each electrode has a width $w_e$ which is about one-quarter wavelength ($\lambda/4$) of a resonant acoustic mode of the resonator 16 or 16', with a spacing between the adjacent electrodes 28 being about one-half wavelength ($\lambda/2$).

By arranging the input and output electrodes 28 (also termed drive and sense electrodes, respectively) of each resonator 16 and 16' as shown in FIGS. 2A and 2B in a so-called "top only transduction" arrangement, a transduction capacitance $C_0$ between each electrode 28 and ground (i.e. the lower metallization 24) appears as a shunt capacitance $C_s$ between the inputs and outputs of each resonator 16 or 16' and ground (i.e. the electrical ground plane formed by the lower metallization 24 which can be connected to a ground terminal of the MEM filter 10).

Figure 2C:
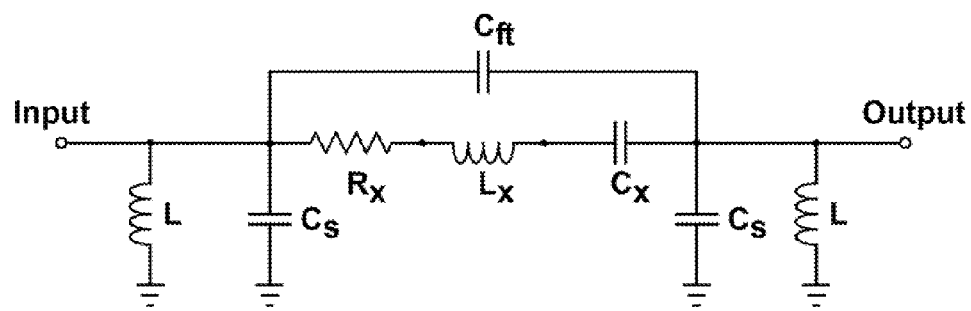
FIG. 2C shows an electrical equivalent model of a portion of each contour-mode resonator in FIG. 2A between one of the inputs (i.e. +In or −In) and an output of the same polarity.

FIG. 2C shows an electrical equivalent model of a portion of each resonator 16 and 16' of FIGS. 2A and 2B between the input and output of a given polarity (i.e. between the positive input, +In, and the positive output, +Out, terminals of each resonator 16 and 16'; or between the negative input, −In, and the negative output, −Out, terminals). This "top only transduction" arrangement also places a feed-through capacitance $C_{ft}$, which is due to the capacitance between the input and output electrodes 28 of each resonator 16 and 16', in parallel with a mechanical resonance due to a series combination of a motional resistance $R_x$, a motional inductance $L_x$, and a motional capacitance $C_x$. By reducing the feed-through capacitance $C_{ft}$, which is in parallel with the mechanical resonance of each resonator 16 and 16', using the "top only transduction" arrangement, a number of resonators 16 can be connected in parallel, and a number of resonators 16' can also be connected in parallel to form the plurality of parallel-connected lattice networks 14 without adversely affecting a stop band rejection of the MEM filter 10. This also allows the resonant frequencies $f_s$ and $f_{sh}$ of the resonators 16 and 16' to be spread over a larger frequency range to increase the bandwidth of the MEM filter 10 from about 1% or less up to about 5% or more.

This "top only transduction" arrangement also allows an inductor L to be added to between the inputs and outputs of the parallel-connected resonators 16 and 16' and ground (see FIGS. 1 and 2C) to resonate out the shunt capacitance $C_s$ of the resonators 16 and 16' and thereby reduce an insertion loss of the MEM filter 10. The inductors L can be located on or off of the substrate 12.

Figure 2D:
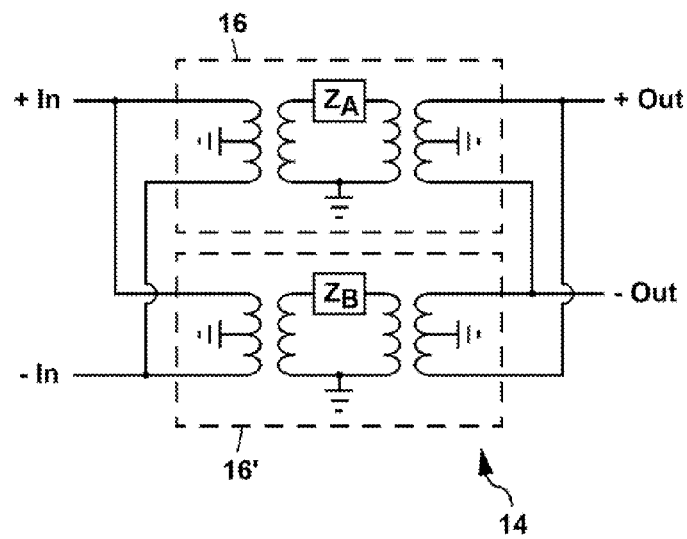
FIG. 2D shows a schematic diagram of the differential lattice network of FIG. 2A with the impedance of the series contour-mode resonator being represented as $Z_A$, and with the impedance of the shunt contour-mode resonator being represented as $Z_B$.

FIG. 2D shows a schematic diagram of the differential lattice network 14 formed by the two contour-mode resonators 16 and 16'. In this schematic diagram, the coupling between the electrodes 28 and the piezoelectric layer 22 is represented by a pair of transformers with the impedance of the series resonator 16 being represented by the box labeled "$Z_A$" and with the impedance of the shunt resonator 16' being represented by the box labeled "$Z_B$". The number and locations of the electrodes 28 for the inputs and outputs in the resonators 16 and 16' function in a manner equivalent to transformers to perform signal transformation and inversion while eliminating the need for any actual transformers or active circuitry in the MEM filter 10.

In the MEM filters 10 of the present invention, the resonators 16 and 16' and the lattice networks 14 formed therefrom are electrically connected in parallel rather than in series. This use of parallel-connected lattice networks 14 in the MEM filters 10 of the present invention provides a lower insertion loss compared to other types of MEM filters which are based on series-connected ladder networks.

Returning to FIG. 2A, the series differential contour-mode resonator 16 and the shunt differential contour-mode resonator 16' can be oppositely oriented (i.e. formed as mirror images of each other with respect to the input and output electrodes 28) to provide a lattice network 14 which is balanced with substantially-equal input and output impedances. Thus, when the series contour-mode resonator 16 comprises a number L of input electrodes 28 and a different number M of output electrodes 28, the shunt contour-mode resonator 16' can be formed with M input electrodes 28 and L output electrodes 28 to form a balanced lattice network 14.

Figure 4:
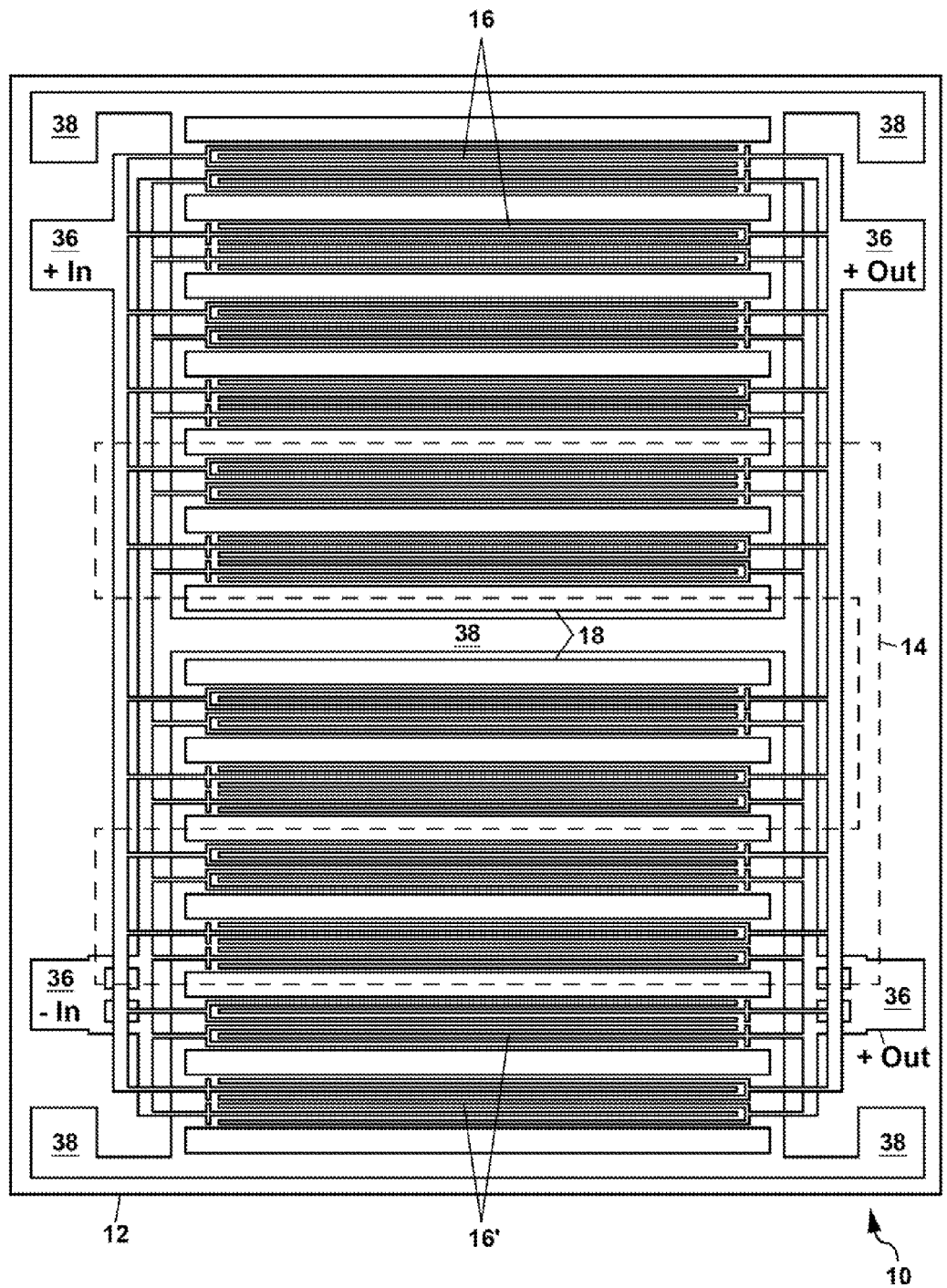
FIG. 4 shows a schematic plan view of a fourth example of the MEM filter according to the present invention, with the MEM filter having three differential lattice networks electrically connected in parallel, and with each differential lattice network being formed from four differential contour-mode resonators. The location of one of the differential lattice networks in indicated by the dashed line.

In other embodiments of the present invention wherein it is desirable for each series or shunt contour-mode resonator to be individually balanced, each contour-mode resonator can be formed in a manner similar to FIG. 2A from a pair of substantially-identical but oppositely oriented resonators which have the same resonant frequency and are electrically connected together to operate as a composite series or shunt contour-mode resonator (see e.g. FIG. 4). In yet other embodiments of the present invention, each contour-mode resonator can be formed as a balanced-unbalanced (balun) contour mode resonator by providing a different number L of input electrodes 28 and M output electrodes 28 (see e.g. FIGS. 8A and 9).

The resonant frequencies $f_s$ of the series differential contour-mode resonator 16 and $f_{sh}$ of the shunt differential contour-mode resonator 16' in the lattice network 14 of FIG. 2A are determined by the width of each resonator 16 or 16' in a direction perpendicular to the length of the electrodes 28 and parallel to the substrate 12, and also by a material speed $C_m$ of the piezoelectric material in each resonator 16 and 16'. In general, the width of each resonator 16 or 16' will be an integer multiple of one-half wavelength ($\lambda/2$) of an acoustic mode of oscillation. The series resonant frequency $f_s$ is given by $f_s = C_m / \lambda_s$ where $\lambda_s$ is the wavelength of the acoustic mode of oscillation in the series resonator 16; and the shunt resonant frequency $f_{sh}$ is given by $f_{sh} = C_m / \lambda_{sh}$ where $\lambda_{sh}$ is the wavelength of the acoustic mode of oscillation in the shunt resonator 16'. The resonant frequency of each contour-mode resonator 16 or 16' can be independently set during fabrication by controlling an overall width for that resonator 16 or 16'; and in this way, a predetermined frequency separation $\Delta f$ can be provided for the resonant frequencies of the two resonators 16 and 16' in each lattice network 14 with $f_{sh} = f_s \pm \Delta f$.

Figure 3A:
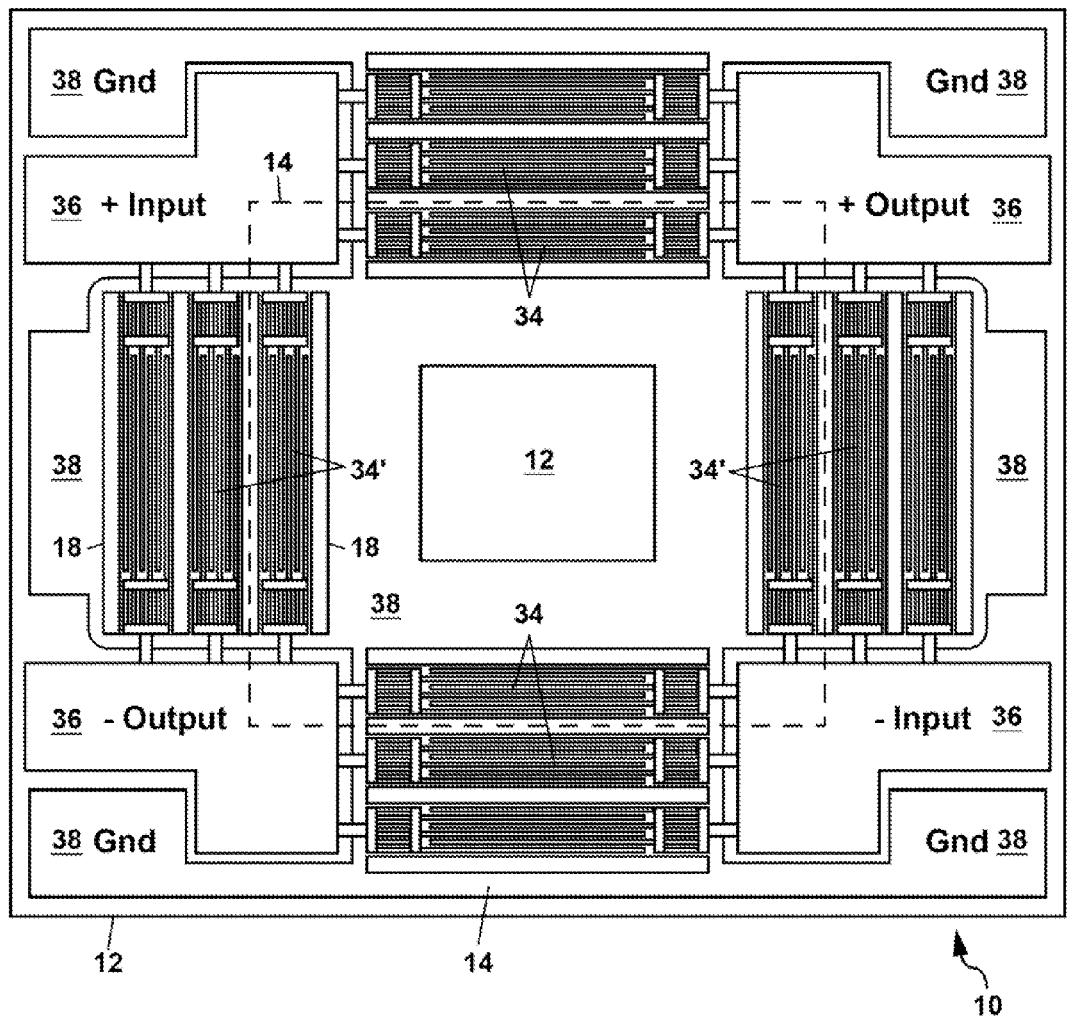
FIG. 3A shows a schematic plan view of a second example of the MEM filter according to the present invention, with the MEM filter having three differential lattice networks electrically connected in parallel, and with each differential lattice network being formed from four single input, single output contour-mode resonators. The location of one of the differential lattice networks in indicated by the dashed line.

FIG. 3A shows a schematic plan view of a second example of the MEM filter 10 of the present invention. This second example employs three differential lattice networks 14 which are electrically connected in parallel with each differential lattice network 14 being formed from four single input, single output contour-mode resonators including two series contour-mode resonators 34 and two shunt contour-mode resonators 34'. One of the series contour-mode resonators 34 in each differential lattice network 14 is connected between a pair of bond pads 36 which are labeled "+Input" and "+Output," and the other series contour-mode resonator 34 is connected between another pair of bond pads 36 which are labeled "−Input" and "−Output." The two shunt contour-mode resonators 34' in each differential lattice network 14 are connected between the bond pads 36 labeled "+Input" and "−Output" and between the bond pads 36 labeled "−Input" and "+Output" as shown in FIG. 3A. In the example of FIG. 3A, a ground plane 38 is formed beneath each contour-mode resonator 34 and 34' and extends over the substrate 12 as shown in FIG. 3A to form a plurality of ground terminals (i.e. bond pads for a ground electrical connection) which are labeled "Gnd."

Each contour-mode resonator 34 and 34' in the example of FIG. 3A can be formed as previously described with reference to FIG. 2B and can be an overtone resonator having a plurality of input and output electrodes 28. The lower metallization 24 can be used to form the ground plane 38 and ground terminals; and the upper metallization 26 can form the electrodes 28 and the bond pads 36.

In the example of FIG. 3A, the three differential lattice networks 14 are in a nested arrangement, with the four innermost resonators 34 and 34' forming a first differential lattice network 14 (indicated by the dashed line), and the four in-between resonators 34 and 34' forming a second differential lattice network 14, and the four outermost resonators 34 and 34' forming a third differential lattice network 14. Each differential lattice network 14 in the MEM filter 10 of FIG. 3A can be formed identically with the same series resonant frequency $f_s$ for the two series contour-mode resonators 34, and with the same shunt resonant frequency $f_{sh}$ for the two shunt contour-mode resonators 34'. Each differential lattice network 14 in FIG. 3A is also balanced with substantially the same input and output impedances. By providing a plurality of differential lattice networks 14 electrically connected in parallel in the MEM filter 10 of FIG. 3A, the input and output impedances are reduced as compared to a single differential lattice network 14. This can be advantageous for impedance matching to a signal source (e.g. an antenna in a communications system).

The MEM filter 10 of FIG. 3A can be formed, for example, to operate at a center frequency of 480 MHz with a 1% bandwidth (i.e. about 5 MHZ). This can be done using overtone contour-mode resonators 34 and 34' which operate in a sixth-order acoustic mode with three input electrodes 28 and three output electrodes 28 in each resonator 34 and 34'. The series resonant frequency can be $f_s$=481.25 MHz and the shunt resonant frequency can be $f_{sh}$=478.75 MHz. An overall die size for this MEM filter 10 including the bond pads 36 can be, for example, 1.2 millimeters (mm)×1.5 mm. An insertion loss of this MEM filter 10 can be about −3 deciBels (dB); and a termination resistance $R_T$ for the MEM filter 10 can be 50 Ohms. The MEM filter 10 can be operated with inductors L connected between each input and output and ground (see FIG. 1) with the inductors having an inductance of about 20 nanoHenrys (nH) and a quality factor Q of about 20.

Figure 3B:
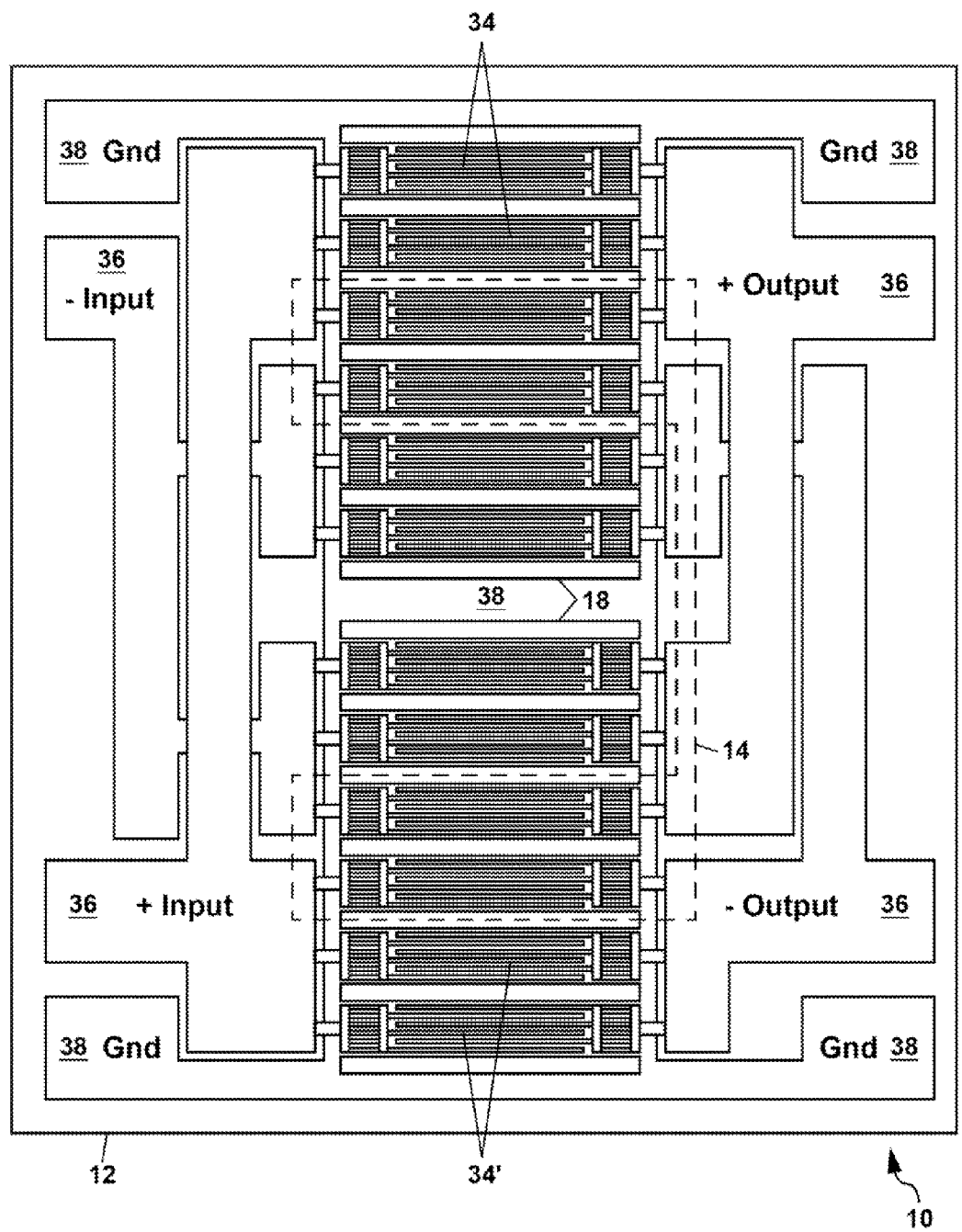
FIG. 3B shows a schematic plan view of third example of the MEM filter according to the present invention. The MEM filter of FIG. 3B is an alternative arrangement to FIG. 3A, with the contour-mode resonators being arranged linearly. The location of one of the differential lattice networks in indicated by the dashed line.

FIG. 3B shows a schematic plan view of an alternative arrangement for the MEM filter 10 of FIG. 3A with the contour-mode resonators 34 end 34' being arranged linearly. In this third example of the MEM filter 10 of the present invention in FIG. 3B, the two series contour-mode resonators 34 for each differential lattice network 14 can be located proximate to one end of the substrate 12; and the two shunt contour-mode resonators 34' for that lattice network 14 can be located proximate to an opposite end of the substrate 12. This is shown for one of the differential lattice networks 14 by the dashed line in FIG. 3B. Bond pads 36 are provided on the substrate 12 for each input and output; and a ground plane 38 is located beneath and around the resonators 34 and 34' and also forms a plurality of ground terminals (Gnd). An overall die size for this third example of the MEM filter 10 can be about the same as that of FIG. 3A when the resonant frequencies $f_s$ and $f_{sh}$ are the same as the example of FIG. 3A.

In other embodiments of the present invention, a larger or smaller number of resonators 34 and 34' can be used in the MEM filters 10 of FIGS. 3A and 3B. In these other embodiments of the present invention, the series resonant frequency $f_s$ for each differential lattice network 14 can be substantially the same, and the shunt resonant frequency $f_{sh}$ for each differential lattice network 14 can also be substantially the same. This is useful to provide a percent bandwidth which is up to about 1%. To provide a percent bandwidth which is larger than 1% and up to about 5%, the resonant frequencies $f_s$ and $f_{sh}$ for each differential lattice network 14 in these other embodiments of the present invention can be made to be different from the frequencies $f_s$ and $f_{sh}$ for all of the other lattice networks 14 in the MEM filter 10.

FIG. 4 shows a schematic plan view of a fourth example of the MEM filter 10 of the present invention. In this fourth example of the present invention three differential lattice networks 14 are used, with each lattice network 14 comprising a pair of differential series contour-mode resonators 16 which are oppositely oriented and electrically connected in parallel, and with each lattice network 14 also comprising a pair of differential shunt contour-mode resonators 16' which are also oppositely oriented and electrically connected together in parallel.

Additionally, in the example of FIG. 4, each differential lattice network 14 has a series resonant frequency $f_s$ and a shunt resonant frequency $f_{sh}$ which are unique (i.e. different from all of the other differential lattice networks 14 in the MEM filter 10). This is useful to broaden the bandwidth of the MEM filter 10 as will now be described with reference to FIGS. 5A-5C which schematically illustrate filter response curves showing the frequency dependence of the transmission of an electrical signal through a plurality of lattice networks 14 which are electrically connected in parallel and a 3 dB bandwidth of the resulting filter as a function of an integer number N (or a multiple thereof) of parallel-connected lattice networks 14 in the MEM filter 10 which have N unique series resonant frequencies $f_s$ and N unique shunt resonant frequencies $f_{sh}$. Thus, for N=1 in FIG. 5A, all of the plurality of parallel-connected lattice networks 14 have one and the same series resonant frequency $f_s$, and all of the plurality of parallel-connected lattice networks 14 also have one and the same shunt resonant frequency $f_{sh}$ which is different from $f_s$. For N=2 in FIG. 5B, the plurality of parallel-connected lattice networks 14 have two unique series resonant frequencies $f_s$, and two unique shunt resonant frequencies $f_{sh}$. And for N=3, in FIG. 5C, the plurality of parallel-connected lattice networks 14 have three unique series resonant frequencies $f_s$, and three unique shunt resonant frequencies $f_{sh}$. Those skilled in the art will understand from the discussion of FIGS. 5A-5C that the number N of unique series resonant frequencies $f_s$ and unique shunt resonant frequencies $f_{sh}$ is arbitrary.

Figure 5A:
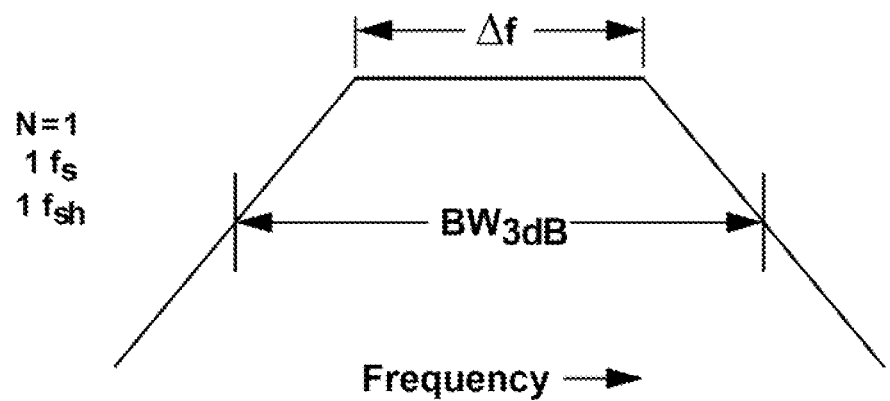
FIG. 5A schematically illustrates a filter response curve for a plurality of parallel-connected lattice networks having the same series resonant frequency $f_s$ and also having the same shunt resonant frequency $f_{sh}$, with the series and shunt resonant frequencies being separated by a frequency interval $\Delta f = |f_s - f_{sh}|$. A 3 dB bandwidth ($BW_{3\,dB}$) for the filter response curve is also shown in FIG. 5A.

In FIG. 5A, with the plurality of parallel-connected lattice networks 14 all having one and the same series resonant frequency $f_s$ and also all having one and the same shunt resonant frequency $f_{sh}$, the filter response curve depends solely upon a frequency separation Δf between the series and shunt resonant frequencies (i.e. $\Delta f = |f_s - f_{sh}|$). In this case, a 3 dB bandwidth ($BW_{3\ dB}$) of the filter response curve is approximately equal to twice the frequency separation Δf.

Figure 5B:
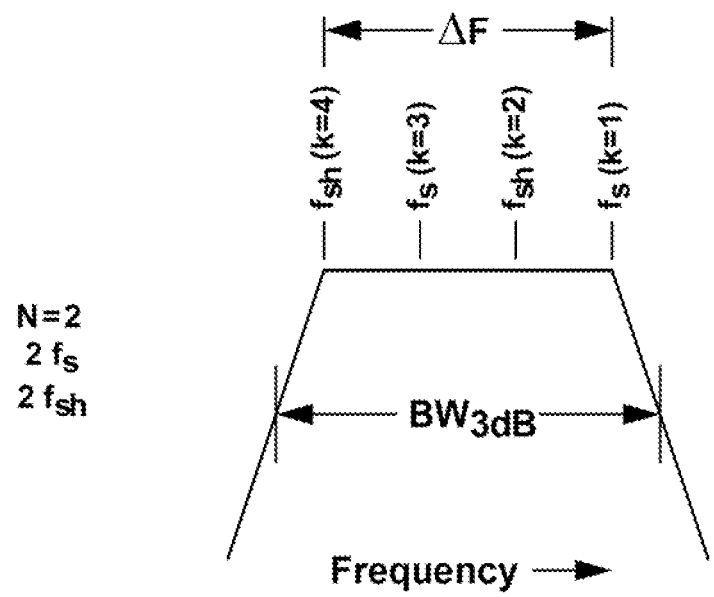
FIG. 5B schematically illustrates the filter response curve for two parallel-connected lattice networks having two different series resonant frequencies $f_s$ (i.e. N=2) and two different shunt resonant frequencies $f_{sh}$ which are alternated and spaced over a frequency interval $\Delta F$.

In FIG. 5B, with two parallel-connected lattice networks 14 having two unique series resonant frequencies $f_s$ and two unique shunt resonant frequencies $f_{sh}$, the series and shunt resonant frequencies can be alternated and spaced about a predetermined frequency interval $\Delta F = f_{max} - f_{min}$ where $f_{max}$ is a maximum frequency of the total number 2N of unique resonant frequencies $f_s$ and $f_{sh}$, and $f_{min}$ is a minimum frequency for the 2N resonant frequencies $f_s$ and $f_{sh}$. The alternated series and shunt frequencies can be substantially evenly spaced over the frequency range $\Delta F$ with the ordering shown in FIG. 5B, or can have a reverse ordering from that in FIG. 5B. Also, in other embodiments of the present invention, the frequency spacing between adjacent series and shunt resonant frequencies can be varied over the frequency interval $\Delta F$ as determined from computational modeling of the MEM filter 10.

In FIG. 5B, by alternating and spacing the 2N unique series and shunt resonant frequencies over the frequency interval $\Delta F$, the 3 dB bandwidth can be reduced relative to that of FIG. 5A. With a substantially-equal frequency spacing between adjacent series and shunt resonant frequencies, the 3 dB filter bandwidth is given by $BW_{3\ dB} \approx 4\Delta F/3$. In addition, a shape factor for the MEM filter 10 of FIG. 5B (defined herein as the frequency bandwidth of the MEM filter 10 at a −20 dB transmission point divided by the frequency bandwidth of the MEM filter 10 at a −3 dB transmission point) is reduced (i.e. improved) as compared to the MEM filter 10 of FIG. 5A so that the MEM filter 10 of FIG. 5B exhibits a sharper roll-off characteristic than the MEM filter 10 of FIG. 5A.

In general, the 3 dB bandwidth of the MEM filters 10 of the present invention can be approximated by:

$$BW_{3\ dB} \approx 2N\Delta F/(2N-1)$$

where N is the number of unique series resonant frequencies $f_s$ and also the number of unique shunt resonant frequencies $f_{sh}$ for the plurality of parallel-connected lattice networks 14 in the MEM filter 10. This approximation for the 3 dB bandwidth takes into account pass band ripple and the termination impedances $R_T$ which are required to reduce the pass band ripple to flatten out the response of the MEM filter 10.

To substantially evenly space the 2N different resonant frequencies $f_s$ and $f_{sh}$ over the 3 dB bandwidth about a predetermined center frequency $f_{center}$, the following formulas can be used:

$$f_s(k) = k_{center} + \Delta F/2 - (k-1)\Delta F/(2N-1), \text{ for } k \text{ odd}$$

$$f_{sh}(k) = f_{center} + \Delta F/2 - (k-1)\Delta F/(2N-1), \text{ for } k \text{ even}$$

where k is an index number which ranges from 1 to 2N to show the ordering of the resonant frequencies $f_s$ and $f_{sh}$ from $f_{max}$ to $f_{min}$. Those skilled in the art will understand that the ordering of the series resonant frequencies $f_s$ and the shunt resonant frequencies $f_{sh}$ can be reversed from that described in the formulas immediately above by using even values of k to calculate the series resonant frequencies $f_s(k)$, and by using odd values of k to calculate the shunt resonant frequencies $f_{sh}(k)$.

Figure 5C:
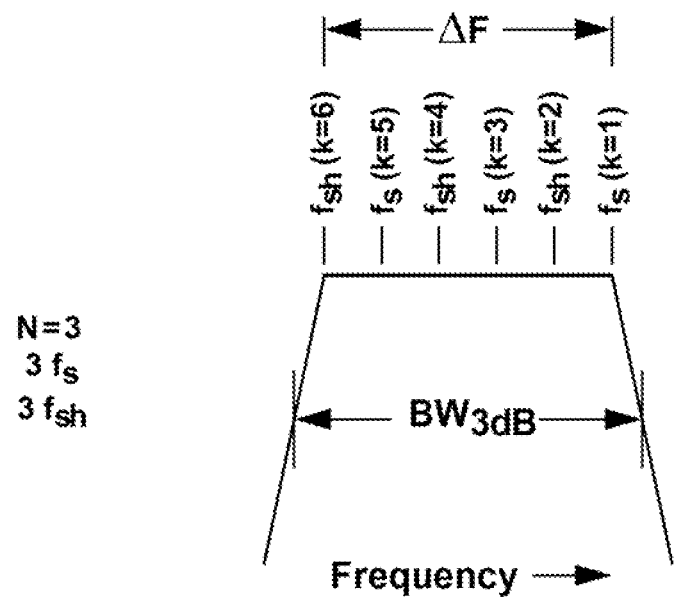
FIG. 5C schematically illustrates the fitter response curve for three parallel-connected lattice networks having three different series resonant frequencies $f_s$ (i.e. N=3) and three different shunt resonant frequencies $f_{sh}$ which are alternated and spaced over the frequency interval $\Delta F$. The parallel-connected lattice networks in FIGS. 5B and 5C with N=2 and N=3, respectively, reduce the 3 dB bandwidth of the MEM filter as compared to the parallel-connected lattice networks in FIG. 5A and also improve a shape factor for the MEM filter.

FIG. 5C schematically illustrates the filter response curve for three lattice networks 14 connected in parallel with three unique (i.e. different) series resonant frequencies $f_s$ and three unique shunt resonant frequencies $f_{sh}$. In this case, the 3 dB bandwidth of the MEM filter 10 is further reduced to be $BW_{3\ dB} \approx 2N\Delta F/(2N-1) \approx 6\Delta F/5$; and the shape factor for the MEM filter 10 is further sharpened compared to that of FIG. 5B.

Figure 6:
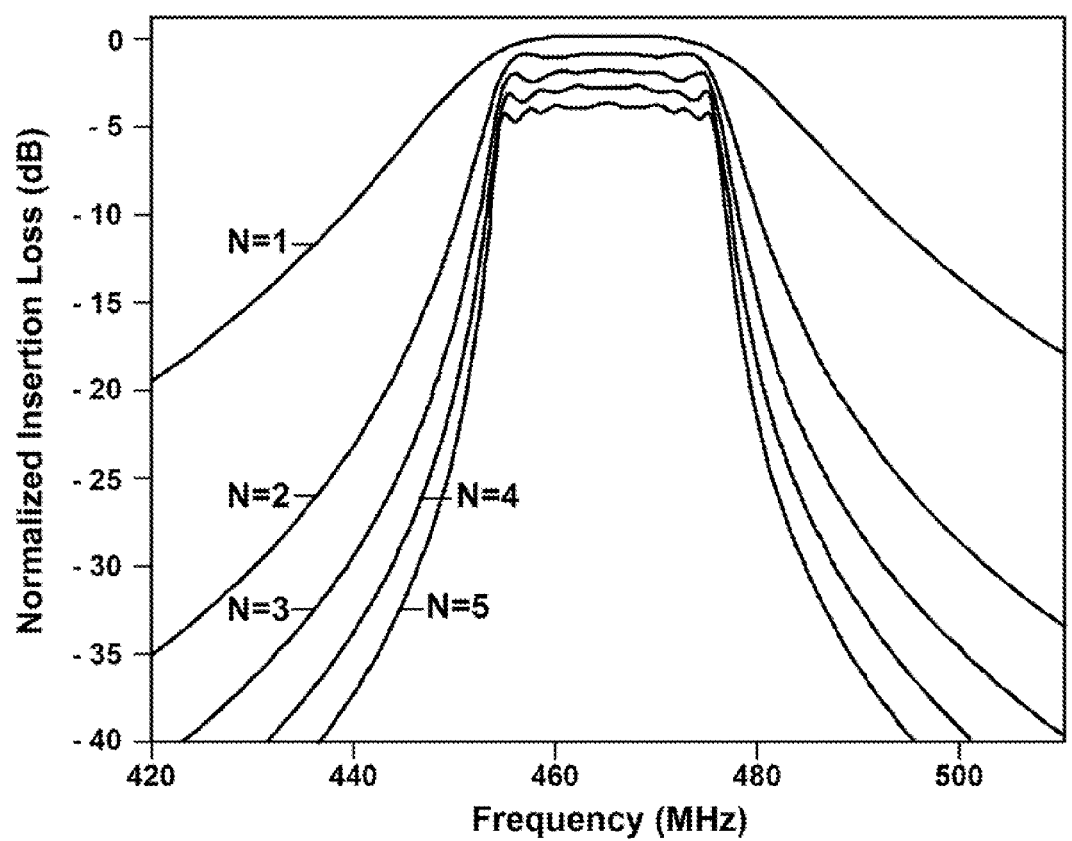
FIG. 6 shows calculated filter response curves for MEM filters of the present invention with a N=1 to N=5 and with a center frequency of 465 MHz.

From FIGS. 5A-5C, one skilled in the art will understand that as the number N (or a multiple thereof) of the plurality of parallel-connected lattice networks 14 with N unique series resonant frequencies $f_s$ and N unique shunt resonant frequencies $f_{sh}$ increases, the 3 dB bandwidth of the MEM filter 10 will decrease according to the above formula for $BW_{3\ dB}$, and the shape factor will sharpen and improve. This is shown in FIG. 6 for numerical calculations of MEM filters 10 with N=1 to N=5. From FIG. 6, an insertion loss for the MEM filters 10 can also be seen to increase as N increases so that there is a tradeoff between improved shape factor and increased insertion loss for the MEM filters 10.

The calculated filter curves in FIG. 6 are for MEM filters 10 similar to the example of FIG. 4 with a center frequency $f_{center} = 465$ MHz, with $\Delta F = 22$ MHz, with a termination impedance $R_T = 50\ \Omega$, and with an unloaded resonator quality factor $Q_{unloaded} = 600$. For these calculated filter curves in FIG. 6, the shunt capacitance $C_s$ was assumed to be zero (i.e. resonated out by an inductor L connected between each filter input and ground, and between each filter output and ground). Additionally, the impedance of each contour-mode resonator at resonance, which is given by:

$$R_x = 2R_T/[(\Delta F\ Q_{unloaded}/N f_{center}) - 1],$$

was increased by a factor of 1.5 for the resonators at the band edges (i.e. at the maximum and minimum values of $f_s$ and $f_{sh}$) for the MEM filters 10 with N>1 to provide a reduced pass band ripple in the calculated filter curves in FIG. 6.

Returning to the example of the MEM filter 10 in FIG. 4, this filter 10 utilizes three differential lattice networks 14 in parallel with each differential lattice network 14 having a unique series resonant frequency $f_s$ and a unique shunt resonant frequency $f_{sh}$ so that N=3 for this MEM filter 10. This MEM filter 10 can be designed to operate at a center frequency $f_{center} = 460$ MHz with a frequency difference $\Delta F = 22$ MHz using six pairs of $6^{th}$ overtone differential contour-mode resonators 16 and 16' to provide about a 5% 3 dB bandwidth for the MEM filter 10. For a first lattice network 14 in the MEM filter 10 of FIG. 4, the series resonant frequency can be $f_s = 471$ MHz; and the shunt resonant frequency can be $f_{sh} = 466.6$ MHz. For a second lattice network 14 in the MEM filter 10, the series resonant frequency can be $f_s = 462.2$ MHz; and the shunt resonant frequency can be $f_{sh} = 457.8$ MHz. And for a third lattice network 14 in the MEM filter 10, the series resonant frequency can be $f_s = 453.4$ MHz; and the shunt resonant frequency can be $f_{sh} = 449$ MHz. For this MEM filter 10, the measured center frequency was 465 MHz and the measured 3 dB bandwidth was 24.7 MHz. The measured insertion loss was −11.7 dB with a shape factor of 1.4 and a pass band ripple of 2 dB. These parameters were measured using a termination impedance $R_T = 150\ \Omega$, and with inductors L with an inductance of 8 nH and Q=20 connected between each filter input and ground and between each filter output and ground.

To space the resonant frequencies $f_s$ and $f_{sh}$ of the series and shunt contour-mode resonators by steps of 4.4 MHz at a center frequency of 460 MHz is difficult when only the spacing between adjacent electrodes 28 in each resonator 16 and 16' is used to control the resonant frequencies $f_s$ and $f_{sh}$. This difficulty is due to a manufacturing grid which is used to make the photolithographic masks which are used to define the locations of the electrodes 28. This manufacturing grid sets a minimum allowed increment in the spacing between adjacent electrodes 28 which conflicts with the requirement that the electrodes 28 be precisely spaced apart by $\lambda/2$ to achieve the exact resonant frequencies needed for the resonators 16 and 16' in each lattice network 14. To overcome this limitation, the width of the electrodes 28 can be varied in addition to the spacing between adjacent electrodes 28. Varying the width of the electrodes 28 affects the material speed $C_m$ of the piezoelectric material in each resonator 16 and 16' to allow a fine tuning for the resonant frequency $f_s$ or $f_{sh}$ therein.

Figure 7:
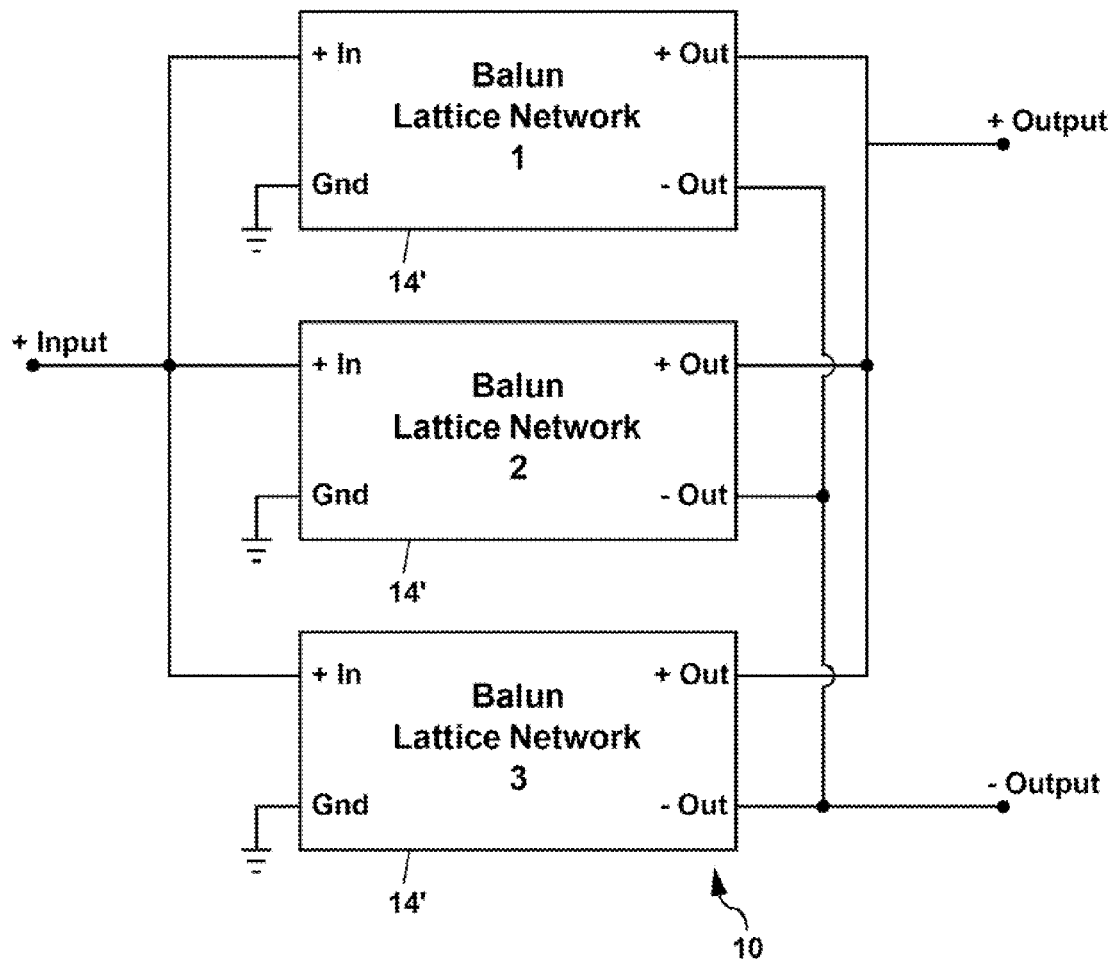
FIG. 7 shows a block diagram of a fifth example of the MEM filter according to the present invention, with each lattice network being a balun lattice network having a single input and a pair of complementary outputs.

FIG. 7 shows a block diagram of a fifth example of the MEM filter 10 of the present invention. In this fifth example, each lattice network is a balun lattice network 14' having a single signal input (labeled as "+In" in FIG. 7), and a pair of complementary positive and negative signal outputs (labeled as "+Out" and "−Out" in FIG. 7). In FIG. 7, three balun lattice networks 14' are electrically connected together in parallel to provide a single input (labeled "+Input") and a pair of complementary outputs (labeled "+Output" and "−Output") for the MEM filter 10. Those skilled in the art will understand from the teachings of the present invention that the number of balun lattice networks 14' which are electrically connected in parallel can be arbitrary. The use of a MEM lattice filter 10 comprising a plurality of balun lattice networks 14' connected in parallel is useful, for example, to filter an electrical signal from an antenna and to provide the filtered electrical signal to a balanced input of a low-noise amplifier (LNA).

In FIG. 7, each balun lattice network 14' can be formed from a series balun contour-mode resonator 40 and a shunt balun contour-mode resonator 40'. Each resonator 40 and 40' can comprise, for example, a single electrode 28 as illustrated in the schematic plan view of FIG. 8A connected to a single input terminal 30 (labeled "+In"), and a pair of electrodes 28 connected to a first output terminal 32 (labeled "+Out") and another pair of electrodes 28 connected to a second complementary output terminal 32 (labeled "−Out"). A ground terminal 42 (labeled "Gnd") can also be provided in the balun lattice network 14' of FIG. 8A, with the ground terminal 42 being electrically connected to a ground plane 38, and with both the ground terminal 42 and ground plane 38 being formed from the lower metallization 24 beneath the piezoelectric layer 22 in each resonator 40 and 40' (see FIG. 2B). Each resonator 40 and 40' can be fabricated using the process steps previously described with reference to FIG. 2B. The various terminals 30, 32, and 42 can be connected to bond pads on the substrate 12 or can be connected to CMOS circuitry on the substrate 12 (e.g. using a plurality of vias when the balun lattice network 14' is located above the CMOS circuitry).

Figure 8A:
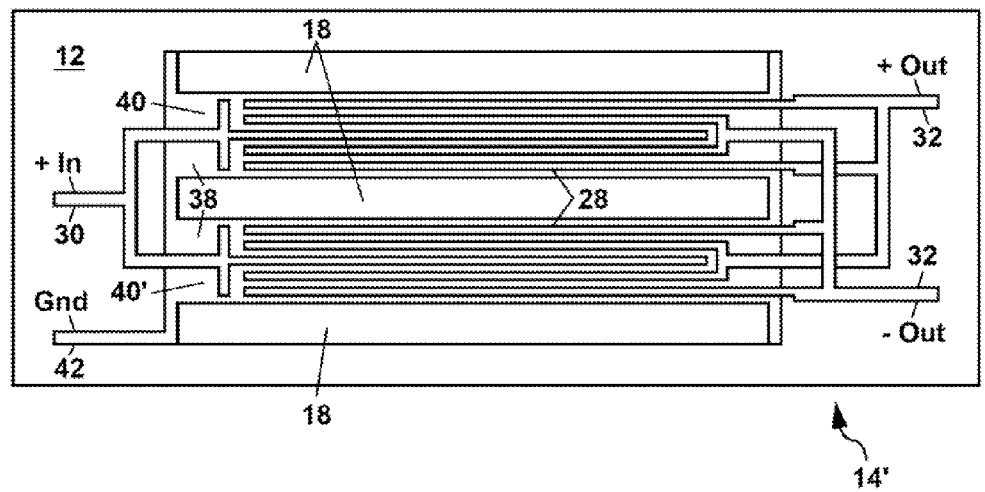
FIG. 8A shows a schematic plan view of one of the balun lattice networks in FIG. 7.

The exact number of electrodes provided in each balun contour-mode resonator 40 and 40' will depend on a mode order of the resonators 40 and 40'. Thus, the electrode arrangement in FIG. 8A is applicable for use in forming $5^{th}$ overtone resonators 40 and 40' having a total of 5 electrodes 28. In other embodiments of the present invention, the mode order of the resonators 40 and 40' in the balun lattice networks 14' can be different from this fifth example of the present invention. Additionally, in other embodiments of the present invention, each balun lattice network 14' can be formed with a pair of complementary inputs (e.g. +In and −In) and a single output (e.g. +Out). This can be done, for example, using the balun lattice network 14' of FIG. 8A with the right-hand-side terminals 32 being used to provide the pair of complementary inputs, and with the left-hand-side terminal 30 being used to provide the single output for the balun lattice network 14'.

Figure 8B:
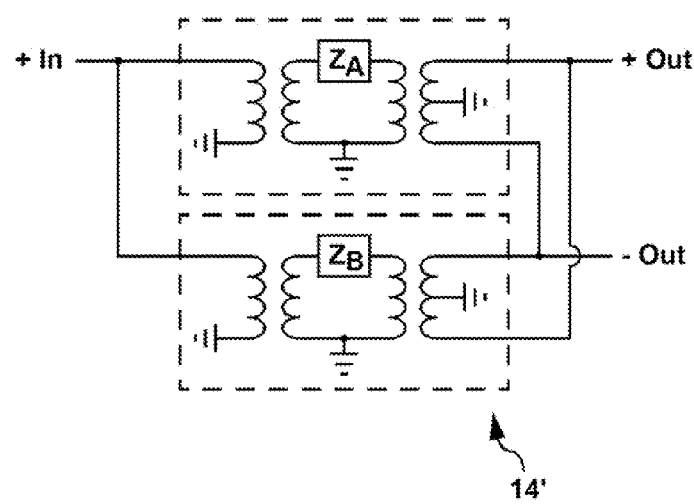
FIG. 8B shows a schematic diagram of the balun lattice network in FIG. 8A, with the impedance of the series contour-mode resonator being represented as $Z_A$, and with the impedance of the shunt contour-mode resonator being represented as $Z_B$.

FIG. 8B shows a schematic diagram of the balun lattice network 14', with $Z_A$ representing the impedance of the series balun resonator 40 and $Z_B$ representing the impedance of the shunt balun resonator 40', and with the electrodes 28 functioning equivalent to transformers at the input and output sides of each resonator 40 and 40'.

Figure 9:
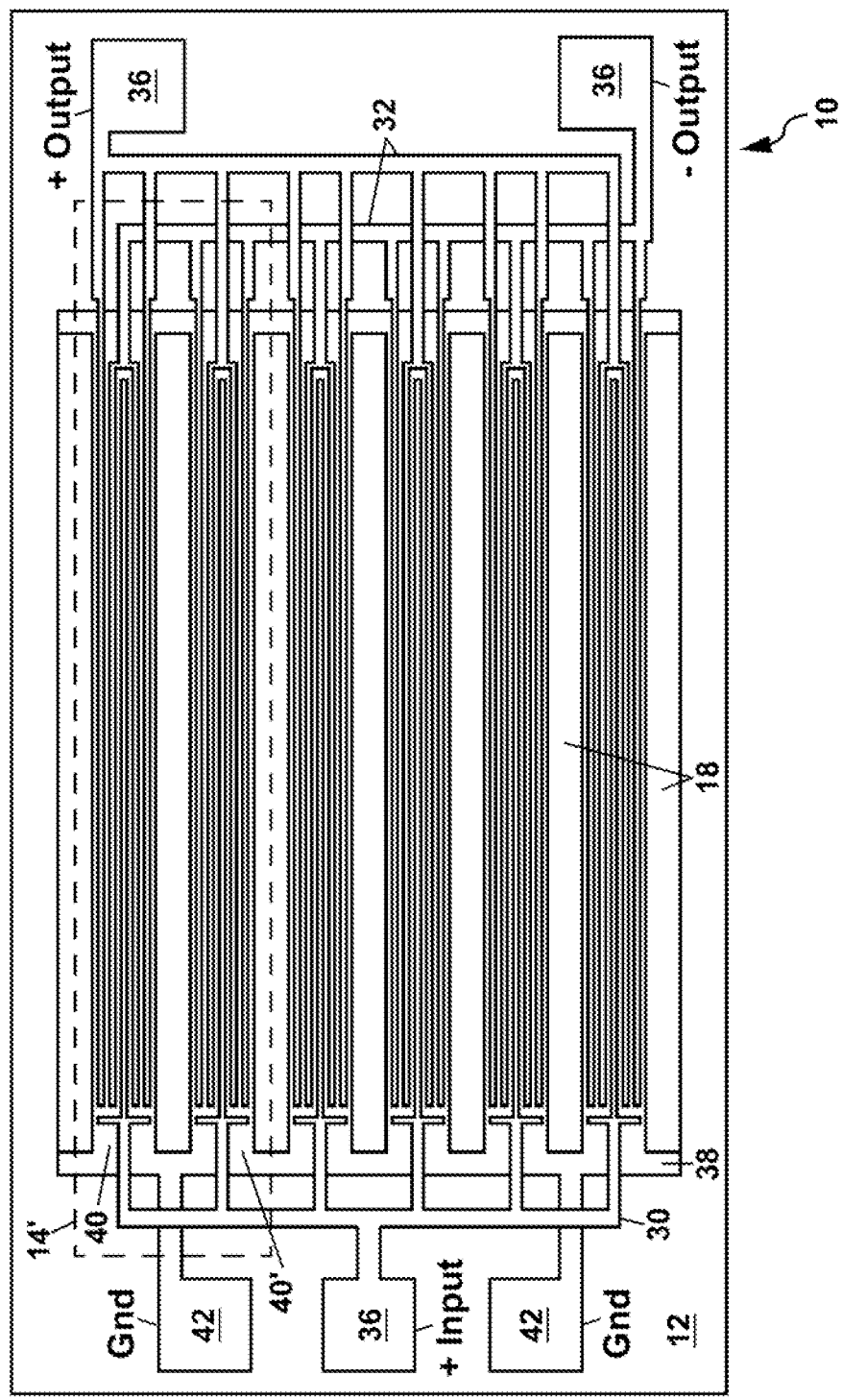
FIG. 9 shows a schematic plan view of a sixth example of a MEM filter according to the present invention, with the MEM filter having three balun lattice networks electrically connected in parallel for operation at a center frequency of 490 MHz using two balun overtone contour-mode resonators in each balun lattice network. The dashed line in FIG. 9 shows the location of one of the balun lattice networks.

FIG. 9 shows a schematic plan view of a sixth example of a MEM filter 10 formed according to the present invention. This sixth example uses three balun lattice networks 14' electrically connected together in parallel for operation at a center frequency of 490 MHz. In the example of FIG. 9, the three balun lattice networks 14' can all have the same series resonant frequencies $f_s$=490.6 MHz and the same shunt resonant frequencies $f_{sh}$=498.4 MHz to provide a MEM filter 10 with N=1 and a 0.25% 3 dB bandwidth. Alternately, the series and shunt resonant frequencies $f_s$ and $f_{sh}$ can be unique for each balun lattice network 14' to provide a MEM filter 10 with N=3 and a larger bandwidth which can be, for example, up to 5% or more. The MEM filter 10 in FIG. 9 can be formed on a substrate 12 with a die size of for example, 0.6×1.1 mm including the bond pads 36 and 42.

Figure 10:
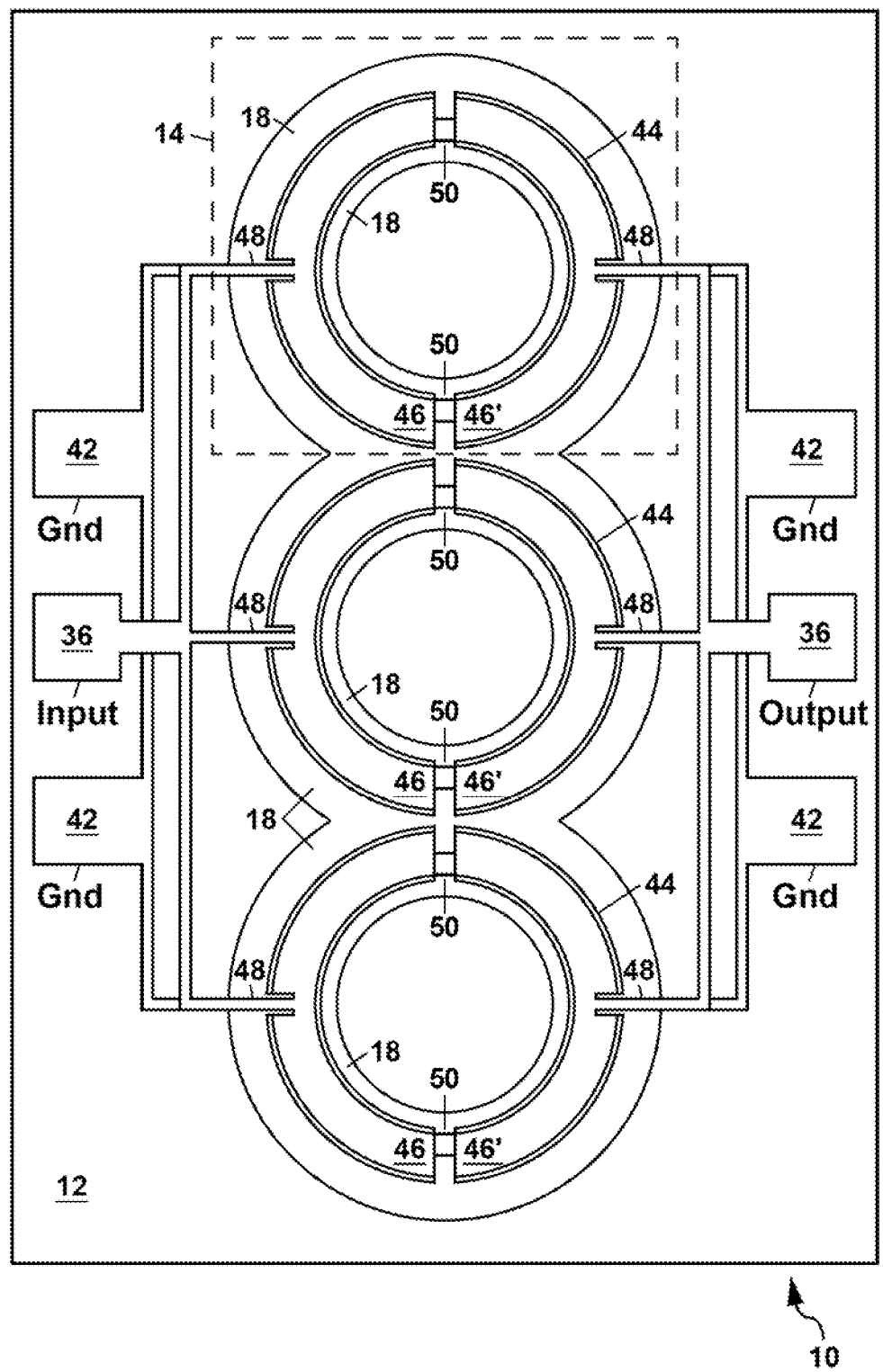
FIG. 10 shows a schematic plan view of a seventh example of a MEM filter according to the present invention, with the MEM filter having three single-input, single-output lattice networks electrically connected in parallel, and with each lattice network comprising a ring contour-mode resonator which operates in two different acoustic modes to provide the series resonant frequency and the shunt resonant frequency. The dashed line in FIG. 10 shows the location of one of the lattice networks.

FIG. 10 shows a schematic plan view of a seventh example of a MEM filter 10 formed according to the present invention. This seventh example uses three single-input, single-output lattice networks 14 connected together in parallel with each lattice network 14 comprising a ring contour-mode resonator 44 which supports two acoustic modes when a time-varying voltage is applied across a piezoelectric layer 22 in one half of resonator 44 beneath a drive electrode 46 to cause this half (designated a drive half) of the ring resonator 44 to expand and contract in the plane of the piezoelectric layer 22 due to the $d_{31}$ piezoelectric coefficient. These two acoustic modes include an anti-symmetric mode in which the drive half of the ring resonator 44 vibrates out of phase with a sense half of the ring resonator 44 wherein a sense electrode 46' is located, and a symmetric mode in which both halves of the ring resonator 44 vibrate in phase. The resonant frequency of the symmetric mode can be designated herein as the series resonant frequency $f_s$, and the resonant frequency of the anti-symmetric mode can be designated herein as the shunt resonant frequency $f_{sh}$. Each ring contour-mode resonator 44 in the MEM filter 10 of FIG. 10 can be formed either as a fundamental-mode ring resonator 44, or as an overtone ring resonator 44.

The ring contour-mode resonators 44 can be formed in a manner similar to that previously described with reference to FIG. 2B with a substrate 12 which can comprise, for example, silicon. A silicon dioxide layer 20 can be blanket deposited over the substrate 12 for use as an etch stop in etching a trench 18 which extends around and underneath each ring resonator 44. The trench 18 can be etched into the substrate 12 as previously described with reference to FIG. 2B. In some cases, a polysilicon layer can be deposited over the substrate 12, with the trench 18 being etched into the polysilicon layer (e.g. when the MEM filter 10 is formed above CMOS circuitry).

A lower metallization 24 (e.g. comprising aluminum or Ti/TiN/Al layers) can be deposited over the silicon dioxide layer 20 and can be patterned to extend beneath the ring resonator 44 and act as a ground plane. This lower metallization 24 can also be patterned to extend beneath a plurality of tethers 48, which suspend the ring resonator 44 from the substrate 12, to connect the ground plane to one or more ground terminals 42 on the substrate 12. A piezoelectric layer 22 (e.g. comprising AlN, $LiNbO_3$, ZnO, or PZT) can then be deposited over the lower metallization 24 and etched to form the ring resonator 44 and tethers 48.

The tethers 48 in FIG. 10 can have a width which is an odd multiple of one-quarter acoustic wavelength ($\lambda/4$) of the ring resonator 44. The tethers 48 can be connected to a midpoint in the width of the ring resonator 44, which is a nodal point of zero displacement, by notching the ring resonator 44 as shown in FIG. 10. Two tethers 48 can be used when each ring resonator 48 is a single input, single output device; whereas four tethers 48 spaced evenly around the ring resonator 48 can be used to form a two input, two output ring resonator 48 (e.g. a differential ring resonator, or a balun ring resonator).

An upper metallization 26 can be deposited over the piezoelectric layer 22 and can be patterned to form the drive and sense electrodes 46 and 46', respectively, which are annular in shape. The upper metallization 26 can extend over top each tether 48 to connect the drive and sense electrodes 46 and 46' to bond pads 36 which can also be formed from the metallization 26. For an overtone ring contour-mode resonator 44, a plurality of the annular drive and sense electrodes 46 and 46' can be interdigitated and spaced apart by a distance of about one-half wavelength (λ/2) of an overtone acoustic mode of the resonator 44, with each interdigitated electrode 46 and 46' having a width $w_e$ which is about one-quarter wavelength (λ/4) of the overtone acoustic mode.

The ring contour-mode resonators 44 in the example of FIG. 10 can each have an inner radius of 87.5 μm and an outer radius of 122.5 μm to provide a ring width of 35 μm with a center frequency of about 120 MHz. In certain embodiments of the present invention, each lattice network 14 in the MEM filter 10 of FIG. 10 can have series resonant frequencies $f_s$ which are the same, and can also have shunt resonant frequencies $f_{sh}$ which are also the same. This is useful to form a MEM filter 10 having a 3-dB bandwidth which is about 1% or less.

In other embodiments of the present invention, each lattice network 14 can have series resonant frequencies $f_s$ which are different from all of the other lattice networks 14 in the MEM filter 10, and shunt resonant frequencies $f_{sh}$ which are also different from all of the other lattice networks 14 in the MEM filter 10. This is useful to form a MEM filter 10 having a larger 3 dB bandwidth of about 1-5%. In these embodiments of the present invention, the center frequency of each ring contour-mode resonator 44 can be predetermined from the size (e.g. outer radius R) of the ring resonator 44 and from its width W. The frequency separation between the series resonant frequency $f_s$ and the shunt resonant frequency $f_{sh}$ in each ring resonator 44 can be varied by changing the ratio R/W or alternately by providing internal notches 50 which extend into the width of the ring resonator 44 between the drive and sense electrodes 46 and 46' as shown in FIG. 10.

A frequency separation $\Delta f = f_s \pm f_{sh}$ between the series resonant frequency $f_s$ and the shunt resonant frequency $f_{sh}$ in each ring contour-mode resonator 44 can be, for example, about 0.8 MHz for the example of FIG. 10, which has a center frequency of about 120 MHz. This frequency separation can be decreased by up to an order of magnitude with the internal notches 50 which can extend up to a few microns (e.g. 1-4 μm) into the width of the ring resonator 44. These internal notches 50 change a coupling stiffness between the drive and sense halves of the resonator 44 to move the series resonant frequency $f_s$ and the shunt resonant frequency $f_{sh}$ closer together. In this way, the notches 50 can be used to define a bandwidth for each individual ring resonator 44 in the MEM filter 10, and also to define an overall bandwidth for the MEM filter 10.

Figure 11:
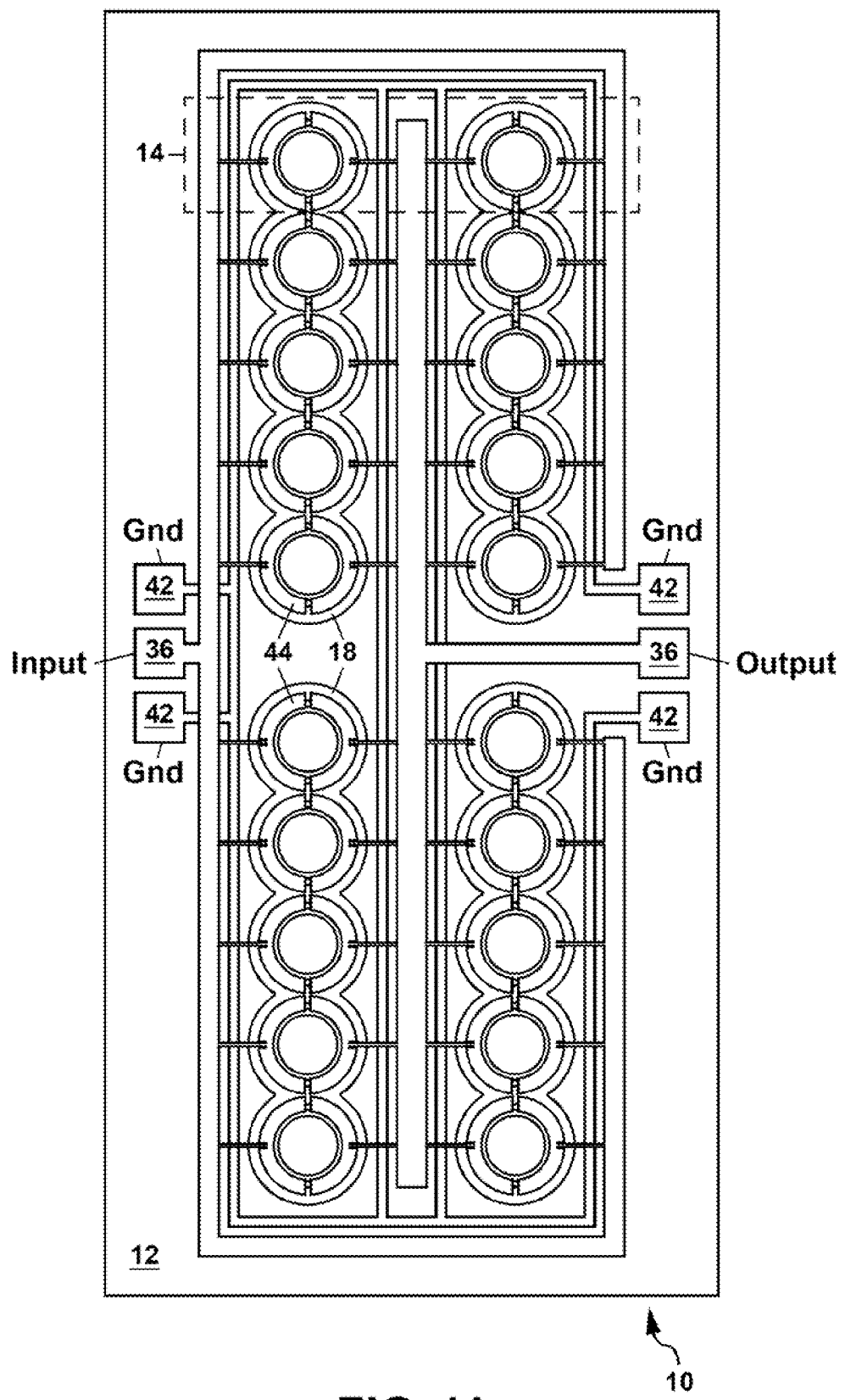
FIG. 11 shows a schematic plan view of an eighth example of the MEM filter of the present invention which comprises ten lattice networks electrically connected in parallel, with each lattice network being formed from two ring contour-mode resonators which are also electrically connected in parallel. The dashed line in FIG. 11 shows the location of one of the lattice networks.

FIG. 11 shows a schematic plan view of an eighth example of the MEM filter 10 of the present invention. In the example of FIG. 11, the MEM filter 10 comprises ten lattice networks 14 electrically connected in parallel, with each lattice network 14 comprising a pair of single input, single output ring contour-mode resonators 44 which are also electrically connected in parallel. The two ring resonators 44 in each lattice network 14 are formed identically with the same center frequency and the same series and shunt resonant frequencies $f_s$ and $f_{sh}$. However, the center frequency for each lattice network 14 is different from all of the other lattice networks 14 in the MEM filter 10 and so are the resonant frequencies $f_s$ and $f_{sh}$. As an example, a frequency separation between the center frequency of the ring resonators 44 in each adjacent lattice network can be 0.5 MHz so that a first lattice network 14 in the example of FIG. 11 can have a center frequency of 117.8 MHz and a tenth lattice network 14 in FIG. 11 can have a center frequency of 122.6 MHz. The series and shunt resonant frequencies $f_s$ and $f_{sh}$ of each lattice network 14 can be centered about the center frequency for that lattice network 14 and can be separated in frequency from each other by, for example, about 0.28-0.29 MHz using a pair of 2 μm internal notches 50 in each ring resonator 44. This is useful to provide a 5 MHz (i.e. 4.2%) 3 dB bandwidth for this MEM filter 10.

In the MEM filter 10 of FIG. 11, the insertion loss can be about 9 dB with a pass band ripple of >5 dB. An LC network can be connected at the input and output of the MEM filter 10 of FIG. 11 to cancel out the shunt capacitance $C_s$ and thereby reduce the insertion loss of the filter 10 to about 6 dB and the pass band ripple to about 1.2 dB.

The ring contour-mode resonators 44 in the example of FIG. 11 can be formed as previously described with reference to FIG. 10, with each ring resonator 44 being suspended from the substrate 12 over a trench 18 by a pair of tethers 48.

A MEM filter 10 operating at 120 MHz with a 5 MHz 3 dB bandwidth can also be formed in a manner similar to the example of FIG. 10 with five lattice networks 14 electrically connected in parallel, with each lattice network 14 being formed from a single ring contour-mode resonator 44. In this case, the center frequency of each ring resonator 44 will be different, with the center frequencies being, for example, 117.7 MHz, 118.8 MHz, 120 MHz, 121.3 MHz and 122.7 MHz. The internal notches 50 can be omitted from the ring resonators 44 to provide a frequency separation between the series resonant frequency $f_s$ and the shunt resonant frequency $f_{sh}$ of about 0.65-0.68 MHz. This MEM filter 10 can provide a 3 dB bandwidth of 5.7 MHz (i.e. 4.75%) with an insertion loss of 9 dB and a pass band ripple of >10 dB. With off-chip inductors with L=80 nH connected between the input of this MEM filter 10 and ground and between the output of the filter 10 and ground to cancel out the shunt capacitance $C_s$ of the resonators 44, the insertion loss can be reduced to about 2 dB, and the pass band ripple can be reduced to about 1.2 dB.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A microelectromechanical (MEM) filter, comprising:
   a substrate; and
   a plurality of lattice networks formed on the substrate and electrically connected in parallel to filter an electrical signal received into at least one input of the plurality of lattice networks and provide the filtered electrical signal to at least one output of the plurality of lattice networks, with each lattice network comprising at least one contour-mode resonator, and with each lattice network having a series resonant frequency and a shunt resonant frequency.

2. The MEM filter of claim 1 wherein the series resonant frequency is substantially the same for each lattice network, and the shunt resonant frequency is substantially the same for each lattice network.

3. The MEM filter of claim 1 wherein the series resonant frequency is different for each lattice network, and the shunt resonant frequency is different for each lattice network.

4. The MEM filter of claim 3 wherein the series resonant frequencies and the shunt resonant frequencies of the plurality of lattice networks are alternated and spaced apart in frequency about a center frequency of the MEM filter.

5. The MEM filter of claim 4 wherein there is a substantially equal frequency interval between each series resonant frequency and an adjacent shunt resonant frequency.

6. The MEM filter of claim 1 wherein each lattice network is a differential lattice network and each differential lattice network comprises a first differential contour-mode resonator and a second differential contour-mode resonator, with each differential contour-mode resonator having a positive input, a negative input, a positive output and a negative output, and with the positive inputs of the first and second differential contour-mode resonators being electrically connected in parallel to form a positive input terminal for that lattice network, and with the negative inputs of the first and second differential contour-mode resonators being electrically connected in parallel to form a negative input terminal for that lattice network, and with the positive output of the first differential contour-mode resonator being electrically connected to the negative output of the second differential contour-mode resonator to form a positive output terminal for that lattice network, and with the negative output of the first differential contour-mode resonator being electrically connected to the positive output of the second differential contour-mode resonator to form a negative output terminal for that lattice network.

7. The MEM filter of claim 6 wherein the first differential contour-mode resonator comprises a number L of input electrodes and a number M of output electrodes, and the second differential contour-mode resonator comprises M input electrodes and L output electrodes:

8. The MEM filter of claim 1 wherein each lattice network is a balun lattice network and each balun lattice network comprises a first balun contour-mode resonator and a second balun contour-mode resonator, with each balun contour-mode resonator having a single input, a positive output, and a negative output, and with the single inputs of the two balun contour-mode resonators being electrically connected in parallel to form an input terminal for that lattice network, and with the positive output of the first balun contour-mode resonator being electrically connected to the negative output of the second balun contour-mode resonator to form a positive output terminal of that lattice network, and with the negative output of the first balun contour-mode resonator being electrically connected to the positive output of the second balun contour-mode resonator to form a negative output terminal of that lattice network.

9. The MEM filter of claim 1 wherein each contour-mode resonator comprises an overtone contour-mode resonator.

10. The MEM filter of claim 1 wherein each contour-mode resonator comprises a piezoelectric material selected from the group consisting of aluminum nitride (AlN), lithium niobate ($LiNbO_3$), zinc oxide (ZnO), and lead-zirconate-titanate (PZT).

11. The MEM filter of claim 1 wherein the substrate comprises a substrate material selected from the group consisting of a semiconductor, glass, alumina and sapphire.

12. The MEM filter of claim 1 wherein each lattice network comprises at least one ring contour-mode resonator and each ring contour-mode resonator comprises two modes of oscillation, with one mode of oscillation being at the series resonant frequency, and with the other mode of oscillation being at the shunt resonant frequency, and wherein a frequency separation between the series resonant frequency and the shunt resonant frequency is defined by at least one internal notch which extends into that ring contour-mode resonator.

13. The MEM filter of claim 12 wherein the series resonant frequency is different for each lattice network, and the shunt resonant frequency is different for each lattice network.

14. A microelectromechanical (MEM) filter, comprising:
a substrate; and
a plurality of lattice networks formed on the substrate and electrically connected in parallel, with each lattice network further comprising:
a plurality of input and output terminals including a positive input terminal, a negative input terminal, a positive output terminal and a negative output terminal;
a first contour-mode resonator having a series resonant frequency $f_s$, with the first contour-mode resonator being electrically connected between the positive input terminal and the positive output terminal;
a second contour-mode resonator having the series resonant frequency $f_s$, with the second contour-mode resonator being electrically connected between the negative input terminal and the negative output terminal;
a third contour-mode resonator having a shunt resonant frequency $f_{sh}$, which is different from the series resonant frequency $f_s$, with the third contour-mode resonator being electrically connected between the positive input terminal and the negative output terminal; and
a fourth contour-mode resonator having the shunt resonant frequency $f_{sh}$, with the fourth contour-mode resonator being electrically connected between the negative input terminal and the positive output terminal.

15. The MEM filter of claim 14 wherein the input and output terminals of each lattice network are electrically connected through an inductor to a ground electrical connection.

16. The MEM filter of claim 14 wherein the series resonant frequency $f_s$ and the shunt resonant frequency $f_{sh}$ of each lattice network in the MEM filter are different from the series resonant frequency $f_s$ and the shunt resonant frequency $f_{sh}$ of all of the other lattice networks in the MEM filter.

17. The MEM filter of claim 14 wherein the series resonant frequency $f_s$ is substantially the same for each lattice network in the MEM filter, and the shunt resonant frequency $f_{sh}$ is substantially the same for each lattice network in the MEM filter.

18. The MEM filter of claim 14 wherein each contour-mode resonator comprises an overtone contour-mode resonator.

19. The MEM filter of claim 14 wherein each contour-mode resonator comprises a piezoelectric material selected from the group consisting of aluminum nitride (AlN), lithium niobate ($LiNbO_3$), zinc oxide (ZnO), and lead-zirconate-titanate (PZT).

20. The MEM filter of claim 14 wherein the substrate comprises a substrate material selected from the group consisting of a semiconductor, glass, alumina, and sapphire.

* * * * *